(12) United States Patent
Gao et al.

(10) Patent No.: US 12,525,572 B2
(45) Date of Patent: Jan. 13, 2026

(54) DIRECT BONDING AND DEBONDING OF CARRIER

(71) Applicant: ADEIA SEMICONDUCTOR BONDING TECHNOLOGIES INC., San Jose, CA (US)

(72) Inventors: Guilian Gao, San Jose, CA (US); Gaius Gillman Fountain, Jr., Youngsville, NC (US)

(73) Assignee: Adeia Semiconductor Bonding Technologies Inc., San Jose, CA (US)

(*) Notice: Subject to any disclaimer, the term of this patent is extended or adjusted under 35 U.S.C. 154(b) by 544 days.

(21) Appl. No.: 17/708,716

(22) Filed: Mar. 30, 2022

(65) Prior Publication Data

US 2022/0320036 A1  Oct. 6, 2022

Related U.S. Application Data

(60) Provisional application No. 63/169,029, filed on Mar. 31, 2021.

(51) Int. Cl.
*H01L 21/00* (2006.01)
*H01L 23/00* (2006.01)

(52) U.S. Cl.
CPC .............. *H01L 24/80* (2013.01); *H01L 24/08* (2013.01); *H01L 2224/08145* (2013.01);
(Continued)

(58) Field of Classification Search
CPC ............ H01L 24/80; H01L 24/08; H01L 2224/08145; H01L 2224/80006;
(Continued)

(56) References Cited

U.S. PATENT DOCUMENTS

| 5,034,343 A | 7/1991 | Rouse et al. |
| 5,322,593 A * | 6/1994 | Hasegawa ........... H01L 21/4857 257/E23.173 |

(Continued)

FOREIGN PATENT DOCUMENTS

| CN | 107611075 A | 1/2018 |
| CN | 112968078 A | 6/2021 |

(Continued)

OTHER PUBLICATIONS

International Search Report and Written Opinion for Intl. Appl. No. PCT/US2022/022673, mailed Jul. 25, 2022, 16 pages.

(Continued)

*Primary Examiner* — Niki H Nguyen
(74) *Attorney, Agent, or Firm* — Knobbe, Martens, Olson & Bear, LLP

(57) ABSTRACT

A method of processing a semiconductor element is disclosed. The method can include providing the semiconductor element that has a first nonconductive material. The first nonconductive material is disposed on a device portion of the semiconductor element. The method can include providing a transparent carrier. The method can include providing an intervening structure that has a second nonconductive material, a photolysis layer, and an opaque layer stacked together. The method can include forming a bonded structure such that the second nonconductive material is directly bonded to the first nonconductive material or to the transparent carrier. The intervening structure is disposed between the semiconductor element and the transparent carrier. The method can include decoupling the transparent carrier from the semiconductor element by exposing the photolysis layer to light through the transparent carrier such that the light decomposes the photolysis layer.

31 Claims, 19 Drawing Sheets

(52) U.S. Cl.
CPC ............... *H01L 2224/80006* (2013.01); *H01L 2224/80895* (2013.01); *H01L 2224/80896* (2013.01)

(58) Field of Classification Search
CPC . H01L 2224/80895; H01L 2224/80896; H01L 2221/68327; H01L 2224/73204; H01L 21/568; H01L 2221/68381; H01L 2224/97; H01L 25/0753; H01L 2224/32145; H01L 2224/48137; H01L 2224/06181; H01L 2224/16227; H01L 2224/16238; H01L 2224/24137; H01L 25/0657; H01L 25/0655; H01L 2224/1308; H01L 2224/80203; H01L 21/6836; H01L 2224/16145; H01L 24/09; H01L 33/48; H01L 2224/81005; H01L 21/304; H01L 2224/0603; H01L 2224/13025; H01L 2224/73104; H01L 2224/48145; H01L 25/0756; H01L 2224/0558

See application file for complete search history.

(56) References Cited

U.S. PATENT DOCUMENTS

| | | | |
|---|---|---|---|
| 5,753,536 A | 5/1998 | Sugiyama et al. |
| 5,771,555 A | 6/1998 | Eda et al. |
| 5,897,743 A | 4/1999 | Fujimoto et al. |
| 5,985,742 A | 11/1999 | Henley et al. |
| 6,080,640 A | 6/2000 | Gardner et al. |
| 6,423,640 B1 | 7/2002 | Lee et al. |
| 6,465,892 B1 | 10/2002 | Suga |
| 6,867,067 B2 | 3/2005 | Ghyselen et al. |
| 6,887,769 B2 | 5/2005 | Kellar et al. |
| 6,908,027 B2 | 6/2005 | Tolchinsky et al. |
| 7,045,453 B2 | 5/2006 | Canaperi et al. |
| 7,105,980 B2 | 9/2006 | Abbott et al. |
| RE39,484 E | 2/2007 | Bruel |
| 7,193,423 B1 | 3/2007 | Dalton et al. |
| 7,226,812 B2 | 6/2007 | Lu et al. |
| 7,713,840 B2 | 5/2010 | Kelly et al. |
| 7,750,488 B2 | 7/2010 | Patti et al. |
| 7,759,050 B2 | 7/2010 | Kessel et al. |
| 7,795,113 B2 | 9/2010 | Swinnen et al. |
| 7,803,693 B2 | 9/2010 | Trezza |
| 7,910,458 B2 | 3/2011 | Henley |
| 7,932,614 B2 | 4/2011 | Codding et al. |
| 8,053,335 B2 | 11/2011 | Yonehara et al. |
| 8,183,127 B2 | 5/2012 | Patti et al. |
| 8,349,635 B1 | 1/2013 | Gan et al. |
| 8,377,798 B2 | 2/2013 | Peng et al. |
| 8,441,131 B2 | 5/2013 | Ryan |
| 8,461,017 B2 * | 6/2013 | Sadaka ............... H01L 24/80 438/455 |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,505,197 B2 | 8/2013 | Blanchard |
| 8,524,533 B2 | 9/2013 | Tong et al. |
| 8,620,164 B2 | 12/2013 | Heck et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,802,538 B1 | 8/2014 | Liu |
| 8,809,123 B2 | 8/2014 | Liu et al. |
| 8,815,620 B2 | 8/2014 | Park et al. |
| 8,841,002 B2 | 9/2014 | Tong |
| 9,093,350 B2 | 7/2015 | Endo et al. |
| 9,142,517 B2 | 9/2015 | Liu et al. |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,299,736 B2 | 3/2016 | Chen et al. |
| 9,308,697 B2 | 4/2016 | Ke et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,385,024 B2 | 7/2016 | Tong et al. |
| 9,394,161 B2 | 7/2016 | Cheng et al. |
| 9,397,001 B2 | 7/2016 | Tanaka |
| 9,431,368 B2 | 8/2016 | Enquist et al. |
| 9,437,572 B2 | 9/2016 | Chen et al. |
| 9,437,832 B2 | 9/2016 | Sakuishi et al. |
| 9,443,796 B2 | 9/2016 | Chou et al. |
| 9,450,115 B2 | 9/2016 | Christensen et al. |
| 9,461,007 B2 | 10/2016 | Chun et al. |
| 9,496,239 B1 | 11/2016 | Edelstein et al. |
| 9,536,848 B2 | 1/2017 | England et al. |
| 9,559,081 B1 | 1/2017 | Lai et al. |
| 9,620,481 B2 | 4/2017 | Edelstein et al. |
| 9,656,852 B2 | 5/2017 | Cheng et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,761,493 B2 | 9/2017 | Celler |
| 9,799,587 B2 | 10/2017 | Fujii et al. |
| 9,832,880 B2 | 11/2017 | Tsai et al. |
| 9,852,988 B2 | 12/2017 | Enquist et al. |
| 9,893,004 B2 | 2/2018 | Yazdani |
| 9,929,050 B2 | 3/2018 | Lin |
| 9,929,054 B2 | 3/2018 | Yonehara et al. |
| 9,941,241 B2 | 4/2018 | Edelstein et al. |
| 9,941,243 B2 | 4/2018 | Kim et al. |
| 9,953,941 B2 | 4/2018 | Enquist |
| 9,954,080 B2 | 4/2018 | Or-Bach et al. |
| 9,960,142 B2 | 5/2018 | Chen et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,086,584 B2 | 10/2018 | Bellman et al. |
| 10,157,766 B2 | 12/2018 | Kang et al. |
| 10,181,546 B2 | 1/2019 | Zou et al. |
| 10,189,048 B2 | 1/2019 | Yamazaki et al. |
| 10,204,893 B2 | 2/2019 | Uzoh et al. |
| 10,236,408 B2 | 3/2019 | Yamazaki et al. |
| 10,269,756 B2 | 4/2019 | Uzoh |
| 10,276,619 B2 | 4/2019 | Kao et al. |
| 10,276,909 B2 | 4/2019 | Huang et al. |
| 10,418,277 B2 | 9/2019 | Cheng et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,508,030 B2 | 12/2019 | Katkar et al. |
| 10,522,499 B2 | 12/2019 | Enquist et al. |
| 10,529,693 B2 | 1/2020 | Agarwal et al. |
| 10,607,883 B2 | 3/2020 | Maruyama et al. |
| 10,707,087 B2 | 7/2020 | Uzoh et al. |
| 10,784,191 B2 | 9/2020 | Huang et al. |
| 10,790,262 B2 | 9/2020 | Uzoh et al. |
| 10,797,202 B2 | 10/2020 | Danesh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,037,919 B2 | 6/2021 | Uzoh et al. |
| 11,056,348 B2 | 7/2021 | Theil |
| 11,069,734 B2 | 7/2021 | Katkar |

(56) References Cited

U.S. PATENT DOCUMENTS

| | | |
|---|---|---|
| 11,088,099 B2 | 8/2021 | Katkar et al. |
| 11,127,738 B2 | 9/2021 | DeLaCruz et al. |
| 11,158,573 B2 | 10/2021 | Uzoh et al. |
| 11,158,606 B2 | 10/2021 | Gao et al. |
| 11,164,891 B2 | 11/2021 | Cable et al. |
| 11,169,326 B2 | 11/2021 | Huang et al. |
| 11,171,117 B2 | 11/2021 | Gao et al. |
| 11,176,450 B2 | 11/2021 | Teig et al. |
| 11,195,748 B2 | 12/2021 | Uzoh et al. |
| 11,205,625 B2 | 12/2021 | DeLaCruz et al. |
| 11,244,920 B2 | 2/2022 | Uzoh |
| 11,256,004 B2 | 2/2022 | Haba et al. |
| 11,264,357 B1 | 3/2022 | DeLaCruz et al. |
| 11,274,234 B2 | 3/2022 | Zhang et al. |
| 11,276,676 B2 | 3/2022 | Enquist et al. |
| 11,296,044 B2 | 4/2022 | Gao et al. |
| 11,329,034 B2 | 5/2022 | Tao et al. |
| 11,348,801 B2 | 5/2022 | Uzoh et al. |
| 11,348,898 B2 | 5/2022 | DeLaCruz et al. |
| 11,355,443 B2 | 6/2022 | Huang et al. |
| 11,791,307 B2 | 10/2023 | Mandalapu et al. |
| 12,300,662 B2 | 5/2025 | Mandalapu et al. |
| 12,374,556 B2 | 7/2025 | Uzoh et al. |
| 2002/0003307 A1 | 1/2002 | Suga |
| 2002/0048906 A1 | 4/2002 | Sakai et al. |
| 2002/0056927 A1 | 5/2002 | Ohuchi et al. |
| 2004/0084414 A1 | 5/2004 | Sakai et al. |
| 2004/0241958 A1 | 12/2004 | Guarini et al. |
| 2005/0029224 A1 | 2/2005 | Aspar et al. |
| 2006/0057945 A1 | 3/2006 | Hsu et al. |
| 2006/0264004 A1 | 11/2006 | Tong et al. |
| 2007/0111386 A1 | 5/2007 | Kim et al. |
| 2008/0166525 A1 | 7/2008 | Swinnen et al. |
| 2008/0280416 A1 | 11/2008 | Bedell et al. |
| 2009/0152655 A1 | 6/2009 | Laming et al. |
| 2010/0263794 A1 | 10/2010 | George et al. |
| 2011/0092051 A1 | 4/2011 | Moriceau et al. |
| 2013/0137244 A1 | 5/2013 | Kramer et al. |
| 2014/0011324 A1 | 1/2014 | Liu et al. |
| 2014/0091458 A1 | 4/2014 | Van Gemert et al. |
| 2014/0094079 A1 | 4/2014 | Ito et al. |
| 2014/0175655 A1 | 6/2014 | Chen et al. |
| 2014/0183728 A1 | 7/2014 | Han et al. |
| 2014/0213039 A1 | 7/2014 | Lee et al. |
| 2014/0273334 A1 | 9/2014 | Christensen et al. |
| 2014/0312511 A1 | 10/2014 | Nakamura et al. |
| 2015/0064498 A1 | 3/2015 | Tong |
| 2015/0091124 A1 | 4/2015 | Liu et al. |
| 2015/0228535 A1 | 8/2015 | Sadaka et al. |
| 2015/0325810 A1 | 11/2015 | Iwase |
| 2015/0348943 A1 | 12/2015 | Chen et al. |
| 2016/0093518 A1 | 3/2016 | Jung et al. |
| 2016/0133486 A1 | 5/2016 | Andry et al. |
| 2016/0141260 A1 | 5/2016 | Chang et al. |
| 2016/0163590 A1 | 6/2016 | Jung et al. |
| 2016/0181228 A1 | 6/2016 | Higuchi et al. |
| 2016/0189982 A1 | 6/2016 | Iguchi |
| 2016/0233111 A1 | 8/2016 | Shiota et al. |
| 2016/0326409 A1 | 11/2016 | Tokuyasu et al. |
| 2016/0343682 A1 | 11/2016 | Kawasaki |
| 2016/0343685 A1 | 11/2016 | Lin et al. |
| 2016/0358898 A1 | 12/2016 | Zhou et al. |
| 2017/0004990 A1 | 1/2017 | Kang et al. |
| 2017/0018450 A1 | 1/2017 | Tang |
| 2017/0069535 A1 | 3/2017 | Masuko |
| 2017/0092620 A1 | 3/2017 | Haba et al. |
| 2017/0179029 A1 | 6/2017 | Enquist et al. |
| 2017/0200756 A1 | 7/2017 | Kao et al. |
| 2018/0012751 A1 | 1/2018 | Kamochi et al. |
| 2018/0138072 A1 | 5/2018 | Andry et al. |
| 2018/0158713 A1 | 6/2018 | Okita et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0204868 A1* | 7/2018 | Kao ..................... H10F 39/809 |
| 2018/0219038 A1 | 8/2018 | Gambino et al. |
| 2018/0269139 A1 | 9/2018 | Chiang et al. |
| 2018/0294241 A1* | 10/2018 | Chen .................. H01L 23/3128 |
| 2018/0301365 A1 | 10/2018 | Kilcoyne et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2018/0351030 A1 | 12/2018 | Goward |
| 2019/0088481 A1 | 3/2019 | Budd et al. |
| 2019/0115277 A1 | 4/2019 | Yu et al. |
| 2019/0131277 A1 | 5/2019 | Yang et al. |
| 2019/0198377 A1 | 6/2019 | Hacker |
| 2019/0198409 A1 | 6/2019 | Katkar et al. |
| 2019/0333550 A1 | 10/2019 | Fisch |
| 2019/0385935 A1 | 12/2019 | Gao et al. |
| 2019/0385966 A1 | 12/2019 | Gao et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0075553 A1 | 3/2020 | DeLaCruz et al. |
| 2020/0108592 A1 | 4/2020 | Tsao et al. |
| 2020/0118973 A1 | 4/2020 | Wang et al. |
| 2020/0227367 A1 | 7/2020 | Haba et al. |
| 2020/0243380 A1 | 7/2020 | Uzoh et al. |
| 2020/0243481 A1 | 7/2020 | Chung et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0388503 A1 | 12/2020 | Uzoh et al. |
| 2020/0395321 A1 | 12/2020 | Katkar et al. |
| 2020/0402960 A1* | 12/2020 | Chen .................. H01L 23/3121 |
| 2020/0411483 A1 | 12/2020 | Uzoh et al. |
| 2021/0098323 A1 | 4/2021 | Yu et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0225795 A1 | 7/2021 | Otremba et al. |
| 2021/0233889 A1 | 7/2021 | Mandalapu et al. |
| 2021/0242152 A1 | 8/2021 | Fountain, Jr. et al. |
| 2021/0265523 A1 | 8/2021 | Pan |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1* | 10/2022 | Suwito .................. H01L 24/00 |
| 2022/0320035 A1 | 10/2022 | Uzoh et al. |
| 2023/0005850 A1 | 1/2023 | Fountain, Jr. |
| 2023/0008039 A1 | 1/2023 | Uzoh et al. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |

(56) References Cited

U.S. PATENT DOCUMENTS

| | | |
|---|---|---|
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2023/0420270 A1 | 12/2023 | Kitabatake et al. |
| 2024/0038702 A1 | 2/2024 | Uzoh |
| 2024/0055407 A1 | 2/2024 | Workman |
| 2024/0079376 A1 | 3/2024 | Suwito et al. |
| 2024/0105674 A1 | 3/2024 | Uzoh et al. |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |
| 2024/0186284 A1 | 6/2024 | Mandalapu et al. |
| 2024/0203917 A1 | 6/2024 | Katkar et al. |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222315 A1 | 7/2024 | Uzoh |
| 2024/0222319 A1 | 7/2024 | Gao et al. |
| 2024/0266255 A1 | 8/2024 | Haba et al. |
| 2024/0282747 A1 | 8/2024 | Mandalapu et al. |
| 2024/0298454 A1 | 9/2024 | Haba |
| 2024/0304593 A1 | 9/2024 | Uzoh |
| 2024/0312951 A1 | 9/2024 | Theil et al. |
| 2024/0332184 A1 | 10/2024 | Katkar et al. |
| 2024/0332227 A1 | 10/2024 | Uzoh et al. |
| 2024/0332231 A1 | 10/2024 | Uzoh |
| 2024/0332267 A1 | 10/2024 | Haba et al. |
| 2024/0387419 A1 | 11/2024 | Mrozek et al. |
| 2025/0004197 A1 | 1/2025 | Haba et al. |
| 2025/0006632 A1 | 1/2025 | Chang et al. |
| 2025/0006642 A1 | 1/2025 | Haba et al. |
| 2025/0006674 A1 | 1/2025 | Uzoh et al. |
| 2025/0006679 A1 | 1/2025 | Theil et al. |
| 2025/0006689 A1 | 1/2025 | Uzoh et al. |
| 2025/0054854 A1 | 2/2025 | Katkar et al. |
| 2025/0079364 A1 | 3/2025 | Uzoh et al. |
| 2025/0096191 A1 | 3/2025 | Gao et al. |
| 2025/0185163 A1 | 6/2025 | Zhao et al. |
| 2025/0218903 A1 | 7/2025 | Uzoh et al. |

FOREIGN PATENT DOCUMENTS

| | | |
|---|---|---|
| JP | 2002-353416 A | 12/2002 |
| JP | 2013-033786 A | 2/2013 |
| JP | 2014-508405 A | 4/2014 |
| JP | 2018-160519 | 10/2018 |
| KR | 10-1128135 | 3/2012 |
| KR | 20210127522 A | 10/2021 |
| TW | 201415583 A | 4/2014 |
| TW | I550735 B | 9/2016 |
| WO | WO 2005/038865 A2 | 4/2005 |
| WO | WO 2005/043584 A2 | 5/2005 |
| WO | WO 2015/113020 A1 | 7/2015 |
| WO | WO 2021/238681 A1 | 12/2021 |

OTHER PUBLICATIONS

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Monk et al., "Hydrofluoric etching of silicon dioxide sacrificial layers," J. ElectroChem. Soc., 1994, vol. 141, pp. 270-274.

Moriceau, H. et al., "Overview of recent direct wafer bonding advances and applications, " Advances in Natural Sciences-Nanoscience and Nanotechnology, 2010, 11 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1(a)-1 (I), 6 pages.

Plobi, A. et al., "Wafer direct bonding: tailoring adhesion between brittle materials," Materials Science and Engineering Review Journal, 1999, R25, 88 pages.

Suga et al., "Bump-less interconnect for next generation system packaging," Electronic Components and Technology Conference, 2001, IEEE, pp. 1003-1008.

Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.

"An Overview of Temporary Wafer Bonding Processes," Processing Theories, https://www.brewerscience.com/processing-theories/temporary-bonding/, downloaded Aug. 23, 2022, 11 sheets.

Bush, Steve, "Electronica: Automotive power modules from On Semi," ElectronicsWeekly.com, indicating an Onsemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Onsemi AR0820 image, cross section of a CMOS image sensor product. The part in the image was shipped on Sep. 16, 2021. Applicant makes no representation that the part in the image is identical to the part identified in the separately submitted reference Bush, Nov. 8, 2018, Electronics Weekly.com ("Bush article"); however, the imaged part and the part shown in the Bush article share the part number "Onsemi AR0820.".

Photo-polymer mass transfer, Terecircuits webpage, www.terecircuits.com/process, downloaded Aug. 23, 2022, 4 pages.

Smart cut, Wikipedia entry, https://en.wikipedia.org/wiki/Smart_cut, 2 sheets.

Sony IMX260 image, a first cross section of Sony product labeled IMX260, showing a hybrid bonded back side illuminated CMOS image sensor with a pad opening for a wire bond. The second image shows a second cross-section with peripheral probe and wire bond pads in the bonded structure. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image.".

Theil, Jeremy A., "Fluorinated amorphous carbon films for low permittivity interlevel dielectrics," J. Vac. Sci. Technol. B, Nov./Dec. 1999, vol. 17, No. 6, pp. 2397-2410.

Theil, Jeremy A. et al., "The effect of thermal cycling on a-C:F, H low dielectric constant films deposited by ECR plasma enhanced chemical vapor deposition," Appears in the Proceedings of the International Interconnect Technology Conference (IITC), 1998, pp. 128-130.

(56) References Cited

OTHER PUBLICATIONS

Theil, Jeremy A. et al., "Thermal stability of a-C:F, H films deposited by electron cyclotron resonance plasma enhanced chemical vapor deposition," Presented at Symposium N of the Spring 1997 MRS Meeting, 1997, 6 pages.
Micro Materials, "Wafer AirDebond®—Air-Assisted Mechanical Debonding", downloaded from https://micromaterials-inc.com/ on Jul. 22, 2024; 8 pages.
Navarro E., "Direct Wafer Bonding Dynamics", Mechanics; Doctoral dissertation, Université Grenoble Alpes; 2014; NNT:2014GRENi023. tel-01048574v2, downloaded from https://theses.hal.science/tel-01048574/document; 116 pages.
Park H.L., International Preliminary Report on Patentability for PCT/US2022/022674, dated Jul. 25, 2022 (7 pages).
Petrovic J.J., "Review mechanical properties of ice and snow," J Mater Scien. Jan. 2003;38: 1-6.
European Extended Search Report for Application No. EP 22781451. 1, mailed Feb. 4, 2025; 5 pages.
3M Science., "Temporary bonding and debonding for advanced packaging". (2021); downloaded on Aug. 22, 2025 from https://www.3m.com/3M/en_US/semiconductor-us/solutions/advancedpackaging/advancedpackaging-tbdb/, 8 pages.
Bedjaoui et al., "Direct bonding and debonding approach of ultrathin glass substrates for high temperature devices." In 2017 IEEE 67th Electronic Components and Technology Conference (ECTC) May 3, 20170 (pp. 725-732).
Rosenthal C., "Temporary bonding and debonding—An overview of today's materials and methods". SUSS MicroTec Inc. (Feb. 2012), 5 pages.

\* cited by examiner

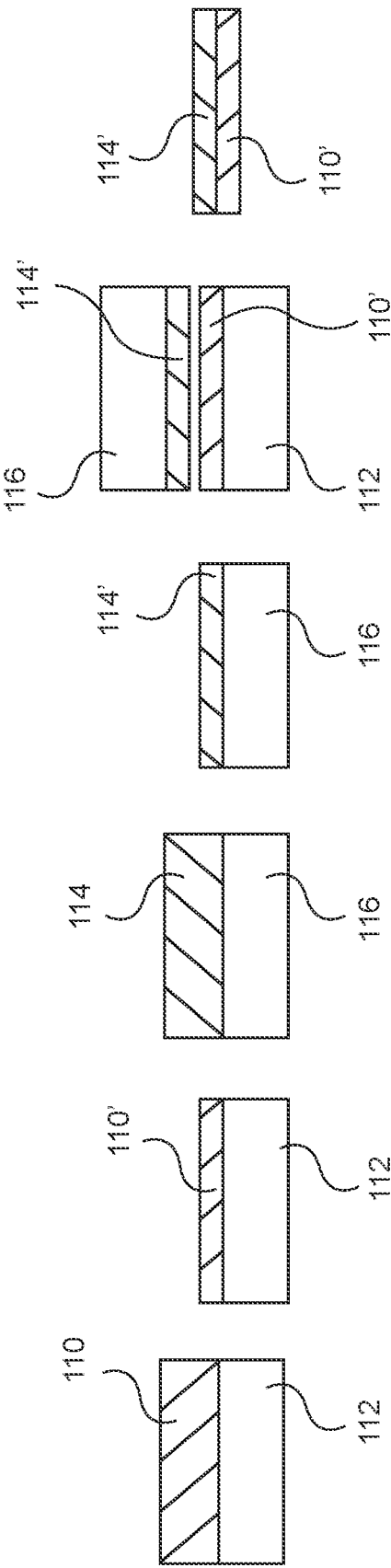

DIRECT BONDING AND DEBONDING OF CARRIER

CROSS-REFERENCE TO RELATED APPLICATIONS

This application claims priority to U.S. Provisional Patent Application No. 63/169,029, filed Mar. 31, 2021, titled "DIRECT BONDING AND DEBONDING OF CARRIER," the entire contents of each of which are hereby incorporated herein by reference.

BACKGROUND

Field

The field relates to direct bonding of a semiconductor element to a carrier, and to removing the carrier after the direct bonding.

Description of the Related Art

Semiconductor elements, such as semiconductor wafers, can be stacked and directly bonded to one another without an adhesive. For example, in some direct bonded structures, nonconductive field regions of the elements can be directly bonded to one another. In some structures, corresponding conductive contact structures can also be directly bonded to one another. In some applications, it can be challenging to form thinned dies and wafers, and/or to conduct backside processing. Accordingly, there remains a continuing need for improved methods and structures for direct bonding.

BRIEF DESCRIPTION OF THE DRAWINGS

Specific implementations will now be described with reference to the following drawings, which are provided by way of example, and not limitation.

FIGS. 4A-4F show a general process of bonding a plurality of devices according to an embodiment.

DETAILED DESCRIPTION

Figure 1A:
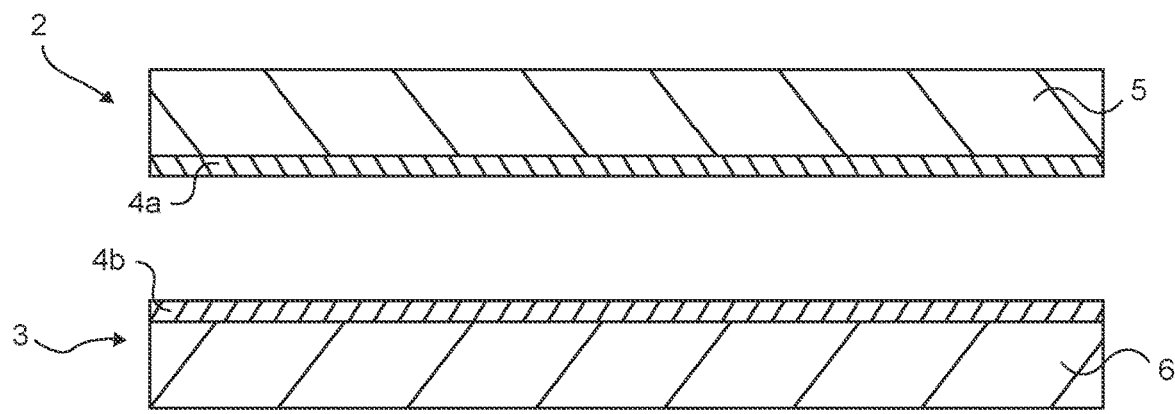
FIG. 1A is a schematic cross sectional side view of two elements prior to bonding.

In various microelectronic devices, two or more elements 2, 3 can be directly bonded to one another without an adhesive to form a bonded structure. The elements 2, 3 of FIGS. 1A and 1B can comprise semiconductor elements in some embodiments. For example, in various embodiments, the first and second elements 2, 3 can comprise semiconductor wafers. In some embodiments, the first and second elements 2, 3 can comprise semiconductor device dies. In some embodiments, one of the first and second elements 2, 3 can comprise a semiconductor wafer, and the other of the first and second elements 2, 3 can comprise a semiconductor device die. In various embodiments disclosed herein, the second element 3 can comprise a carrier which can be temporarily direct bonded to the first element 2, and subsequently removed (e.g., after thinning and/or other processing). For example, in some embodiments, the first element 2 can comprise a semiconductor element (e.g., a singulated integrated device die or an unsingulated wafer) having a device portion 5 and a first non-conductive bonding material 4a on the device portion 5. The device portion 5 can comprise a semiconductor material with active circuitry formed therein. The second element 3 can comprise a substrate 6 and a second non-conductive bonding material 4b on the substrate 6. In some embodiments, the substrate 6 can comprise glass or a semiconductor (such as silicon).

Figure 1B:
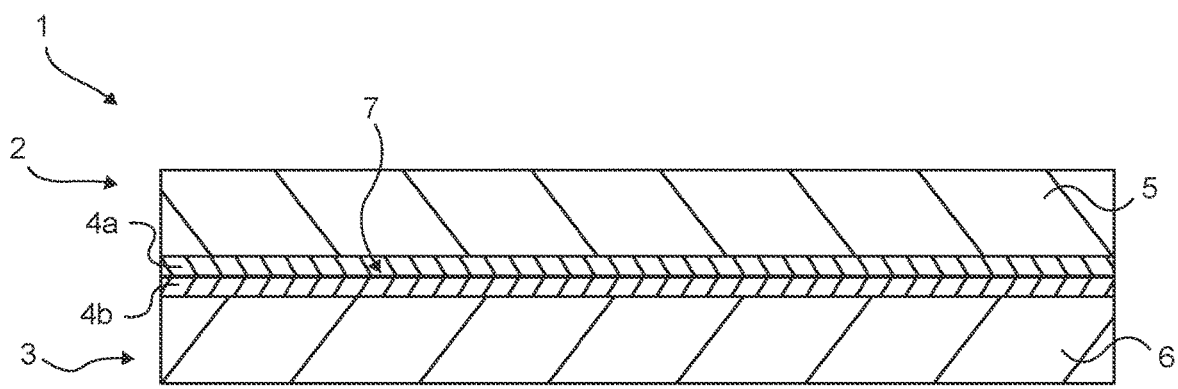
FIG. 1B is a schematic cross sectional side view of the two elements shown in FIG. 1A after bonding.

In various embodiments, as shown in FIGS. 1A-1B, the non-conductive (e.g., semiconductor or inorganic dielectric) bonding material 4a of the first element 2 can be directly bonded to the corresponding non-conductive (e.g., semiconductor or inorganic dielectric) bonding material 4b or field region of the second element 3 without an adhesive. In some embodiments (not shown), a conductive region (e.g., a metal pad or contact structure) of the first element 2 can be directly bonded to a corresponding conductive region (e.g., a metal pad or contact structure) of the second element 3 without an adhesive. In some embodiments, the non-conductive material 4a of the first element 2 can be directly bonded to the corresponding non-conductive material 4b of the second element 3 using bonding techniques without an adhesive using the direct bonding techniques disclosed at least in U.S. Pat. Nos. 9,564,414; 9,391,143; and 10,434,749, the entire contents of each of which are incorporated by reference herein in their entirety and for all purposes. Additional examples of hybrid bonding may be found throughout U.S. Pat. No. 11,056,390, the entire contents of which are incorporated by reference herein in their entirety and for all purposes. In other applications, in a bonded structure 1, a non-conductive material of a first element 2 can be directly bonded to a conductive material of a second element 3, such that a conductive material of the first element 2 is intimately mated with a non-conductive material of the second element 3. Suitable dielectric bonding surface or materials for direct bonding include but are not limited to inorganic dielectrics, such as silicon oxide, silicon nitride, or silicon oxynitride, or can include carbon, such as silicon carbide, silicon oxycarbonitride, low K dielectric materials, SICOH dielectrics, silicon carbonitride or diamond-like carbon or a material comprising of a diamond surface. Such carbon-containing ceramic materials can be considered inorganic, despite the inclusion of carbon.

In various embodiments, direct bonds can be formed without an intervening adhesive. For example, semiconductor or dielectric bonding surfaces can be polished to a high degree of smoothness. The bonding surfaces can be cleaned and exposed to a plasma and/or etchants to activate the surfaces. In some embodiments, the surfaces can be terminated with a species after activation or during activation (e.g., during the plasma and/or etch processes). Without being limited by theory, in some embodiments, the activation process can be performed to break chemical bonds at the bonding surface, and the termination process can provide additional chemical species at the bonding surface that improves the bonding energy during direct bonding. In some embodiments, the activation and termination are provided in the same step, e.g., a plasma or wet etchant to activate and terminate the surfaces. In other embodiments, the bonding surface can be terminated in a separate treatment to provide the additional species for direct bonding. In various embodiments, the terminating species can comprise nitrogen. For example, in some embodiments, the bonding surface(s) can be exposed to a nitrogen-containing plasma. Further, in some embodiments, the bonding surfaces can be exposed to fluorine. For example, there may be one or multiple fluorine peaks near layer and/or bonding interfaces, particularly dielectric bonding interfaces. Thus, in the directly bonded structures, the bonding interface between two non-conductive materials can comprise a very smooth interface with higher nitrogen content and/or fluorine peaks at the bonding interface. Additional examples of activation and/or termination treatments may be found throughout U.S. Pat. Nos. 9,564,414; 9,391,143; and 10,434,749, the entire contents of each of which are incorporated by reference herein in their entirety and for all purposes.

In various embodiments, conductive contact pads of the first element can also be directly bonded to corresponding conductive contact pads of the second element (for example, in arrangements in which both elements have contact pads). For example, a direct hybrid bonding technique can be used to provide conductor-to-conductor direct bonds along a bond interface that includes covalently direct bonded dielectric-to-dielectric surfaces, prepared as described above. In various embodiments, the conductor-to-conductor (e.g., contact pad to contact pad) direct bonds and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes. The bond structures described herein can also be useful for direct metal bonding without nonconductive region bonding, or for other bonding techniques.

In some embodiments, inorganic dielectric bonding surfaces can be prepared and directly bonded to one another without an intervening adhesive as explained above. In direct bonded structures that have contact pads, the conductive contact pads (which may be surrounded by nonconductive dielectric field regions) may also directly bond to one another without an intervening adhesive. In some embodiments, the respective contact pads can be recessed below exterior (e.g., upper) surfaces of the dielectric field or nonconductive bonding regions, for example, recessed by less than 30 nm, less than 20 nm, less than 15 nm, or less than 10 nm, for example, recessed in a range of 2 nm to 20 nm, or in a range of 4 nm to 10 nm. The coefficient of thermal expansion (CTE) of the dielectric material can range between 0.1 ppm/° C. and 5 ppm/° C., for example, and the CTE of the conductive material can range from 6 ppm/° C. and 40 ppm/° C., or between 8 ppm/° C. and 30 ppm/° C. The differences in the CTE of the dielectric material and the CTE of the conductive material restrain the conductive material from expanding laterally at subsequent thermal treating operations. The nonconductive bonding regions can be directly bonded to one another without an adhesive at room temperature in some embodiments and, subsequently, the bonded structure can be annealed. Upon annealing, the contact pads can expand with respect to the nonconductive bonding regions and contact one another to form a metal-to-metal direct bond. Beneficially, the use of hybrid bonding techniques, such as Direct Bond Interconnect, or DBI®, available commercially from Xperi of San Jose, CA, can enable high density of pads connected across the direct bond interface (e.g., small or fine pitches for regular arrays). In various embodiments, the contact pads can comprise copper, although other metals may be suitable. In arrangements in which the first and second elements 2, 3 do not have contact pads at the bonding surface, then the nonconductive materials can be directly bonded at room temperature without a subsequent anneal to effectuate metal contact.

Thus, in direct bonding processes, a first element can be directly bonded to a second element without an intervening adhesive. In some arrangements, the first element can comprise a singulated element, such as a singulated integrated device die. In other arrangements, the first element can comprise a carrier or substrate (e.g., a wafer) that includes a plurality (e.g., tens, hundreds, or more) of device regions that, when singulated, form a plurality of integrated device dies. Similarly, the second element can comprise a singulated element, such as a singulated integrated device die. In other arrangements, the second element can comprise a carrier or substrate (e.g., a wafer). In some embodiments, multiple dies having different CTEs may be bonded on the same carrier. In some embodiments, the CTE of the substrate of the bonded die can be similar to the CTE of the substrate of the carrier. In other embodiments the CTE of the substrate of the bonded die may be different from the CTE of the substrate of the carrier. The difference in CTEs between bonded dies or between bonded dies and the carrier may range between 1 ppm/° C. and 70 ppm/° C. and less than 30 ppm/° C., for example, less than 12 ppm/° C.

As explained herein, the first and second elements can be directly bonded to one another without an adhesive, which is different from a deposition process. The first and second elements can accordingly comprise non-deposited elements. Further, directly bonded structures, unlike deposited layers, can include a defect region along the bond interface in which nanovoids are present. The nanovoids may be formed due to activation of the bonding surfaces (e.g., exposure to a plasma). As explained above, the bond interface can include concentration of materials from the activation and/or last chemical treatment processes. For example, in embodiments that utilize a nitrogen plasma for activation, a nitrogen peak can be formed at the bond interface. In embodiments that utilize an oxygen plasma for activation, an oxygen peak or oxygen rich layer can be formed at the bond interface. In some embodiments, the bond interface can comprise a nitrogen-terminated inorganic non-conductive material, such as nitrogen-terminated silicon, silicon oxide, silicon nitride, silicon oxynitride, silicon carbide, silicon oxycarbide, silicon oxycarbonitride, or silicon carbonitride, with levels of nitrogen present at the bonding interface that are indicative of nitrogen termination of at least one of the elements prior to direct bonding. Other than nitrogen-containing dielectrics, the nitrogen content of the non-conductive material typically has a gradient peaking at or near the surface. In some embodiments, nitrogen and nitrogen related moieties may not be present at the bonding interface. As explained herein, the direct bond can comprise a covalent bond, which is stronger than van Der Waals bonds. The bonding layers can also comprise polished surfaces that are planarized to a high degree of smoothness.

In various embodiments in which the elements 2, 3 have metallic contact pads that are directly bonded, the metal-to-metal bonds between the contact pads can be joined such that metal grains (e.g., copper grains) grow into each other across the bond interface. In some embodiments, the copper can have grains oriented vertically along the 111 crystal plane for improved copper diffusion across the bond interface. In some embodiments, however, other copper crystal planes can be oriented vertically relative to the contact pad surface. The nonconductive bond interface can extend substantially entirely to at least a portion of the bonded contact pads, such that there is substantially no gap between the nonconductive bonding regions at or near the bonded contact pads. In some embodiments, a barrier layer may be provided under the contact pads (e.g., which may include copper). In other embodiments, however, there may be no barrier layer under the contact pads, for example, as described in U.S. Pat. No. 11,195,748, which is incorporated by reference herein in its entirety and for all purposes.

In some applications, it may be desirable to utilize thinned semiconductor elements, for example, in multi-element device stacks, such as memory devices. For example, a semiconductor element (such as a semiconductor device wafer) can be temporarily bonded to a carrier (e.g., a glass or silicon carrier wafer) by way of an adhesive, such as a heat curable or UV curable adhesive (e.g., an organic adhesive). The backside of the semiconductor element can be thinned by, for example, grinding and/or chemical mechanical polishing (CMP). Moreover, additional backside processing may be performed on the backside of the semiconductor element with the semiconductor element adhered to the carrier. For example, metallization or back-end-of-line (BEOL) layers or films may be deposited or otherwise provided on the thinned semiconductor element.

However, the use of adhesives in temporary bonds can be challenging in a number of respects. For example, as the device wafer is thinned, the residual stress from the BEOL film may cause lateral growth of a die size because the organic adhesive may not provide sufficient bond strength to constrain the lateral growth of the device wafer. Furthermore, the mechanical stability of the adhesive bond between the device wafer and the carrier wafer during the thinning process (e.g., a grinding process) may deteriorate or become unreliable due to the forces imparted during thinning. In some cases, the thinning process may also cause the thickness of the device wafer to vary significantly so as to exceed a desired total thickness variation (TTV). For example, the intervening temporary adhesive between the device wafer and the carrier wafer can have non-uniformities that can result in excessive thickness variation upon thinning. Moreover, the temporary adhesive bond may not have sufficient thermal and/or chemical stability when exposed to various processes. For example, the temporary adhesive may degrade when exposed to the chemicals used for wafer cleaning, electrochemical deposition (ECD), and/or CMP. The adhesive may alternatively or additionally decompose during deposition and/or etch processes (such as chemical vapor deposition (CVD), plasma-enhanced CVD, physical vapor deposition, etc.). In addition, when the carrier and adhesive are removed from the device wafer, the device wafer may include residue from the adhesive, which may cause the use of an extra cleaning step. Accordingly, there remains a continuing need for improved methods and structures for thinning a semiconductor element.

Figure 2:
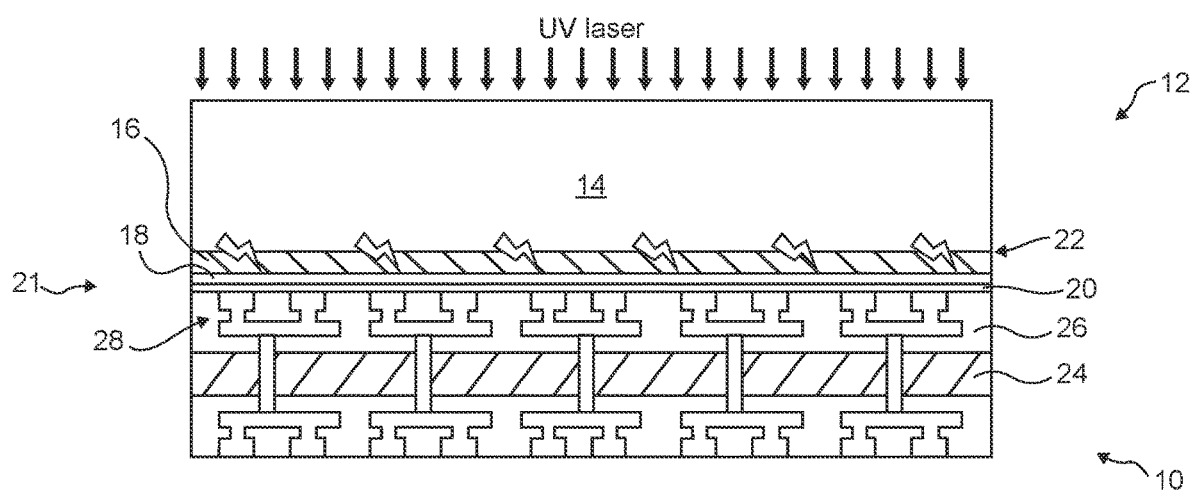
FIG. 2 is a schematic cross sectional view of a semiconductor element bonded to a carrier structure, according to an embodiment.

FIG. 2 is a schematic cross sectional view of a semiconductor element 10 bonded to a carrier structure 12, according to an embodiment. The carrier structure 12 can serve as a temporary support for the semiconductor element 10 during various processing steps, such as thinning, backside metallization, and/or other processing. The carrier structure 12 can include a transparent carrier 14 (e.g., glass), a nonconductive layer 16, a photolysis layer 18, and an opaque blocking layer 20 (e.g., a metal in some embodiments). The nonconductive layer 16, the photolysis layer 18, and the opaque layer 20 can together define an intervening or intermediate structure 21, The transparent carrier 14 and the nonconductive layer 16 can be bonded along a bonding interface 22. The opaque layer 20 can comprise, for example, titanium and/or tungsten. In some embodiments, an adhesion layer (see FIG. 7A) can be provided between the nonconductive layer 16 of the carrier structure 12 and the photolysis layer 18. For example, a nitride adhesion layer can be disposed between the nonconductive layer 16 and the photolysis layer 18. In the illustrated embodiment, the semiconductor element 10 comprises a silicon device wafer 24. However, the semiconductor element 10 can comprise a semiconductor device element in wafer form or as a singulated integrated device die. The semiconductor element 10 can comprise a nonconductive field region 26 and a conductive feature 28.

In the illustrated embodiment, the transparent carrier 14 comprises a glass carrier. The transparent carrier 14 can comprise any suitable material that is transparent to a wavelength range of light impinging on the transparent carrier 14. For example, the transparent carrier 14 can comprise an ultraviolet (UV) transparent carrier. In some embodiments, the transparent carrier 14 can be directly bonded to the nonconductive layer 16. The use of direct bonding technique to bond the transparent carrier 14 and the nonconductive layer 16 can enable reliable bonding while minimizing a total thickness variation (TTV). In the illustrated embodiment, the nonconductive layer 16 comprises an inorganic dielectric layer, such as silicon oxide, e.g., a low temperature oxide (LTO) layer. In some embodiments, the nonconductive layer 16 of the carrier structure 14 can comprise a dielectric bonding layer, such as silicon oxide, silicon oxynitride, silicon nitride, silicon oxynitrocarbide, etc. The nonconductive layer 16 can be relatively thin, such as less than 300 nm.

In the illustrated embodiment, the photolysis layer 18 comprises a photolysis polymer layer, and the opaque layer comprises a metal layer. The photolysis layer 18 can have a thickness in a range of 100 nm to 1 μm, or in range of 100 nm to 500 nm. The metal layer can have a thickness in a range of 20 nm to 100 nm. In some embodiments, the photolysis layer 18 can comprise any suitable photolysis material. As shown in FIG. 2, the photolysis layer 18 can be exposed to a UV light (e.g., a UV laser) through the transparent carrier 14. The photolysis layer 18 can react with the UV light and decouple the nonconductive layer 16 of the carrier structure 12 from the opaque layer 20. The photolysis material is a material that includes a compound that can be broken down or decomposed by photons. A sufficient photon energy may be provided to decompose the photolysis material. Light having an energy higher than an energy of visible light may be more suitable for providing a sufficient photon energy than light having a wavelength below visible light. In various embodiments disclosed herein, UV light, x-rays, and gamma rays may be used to decompose the photolysis material. Decoupling of the nonconductive layer from the opaque layer 20 using the photolysis material can take place without applying external pressure or heat.

Removing the transparent carrier 14 after processing the semiconductor element 10 can free the semiconductor element 10 to expand laterally. For a relatively large die with very fine bonding pitch applications, appropriate dimensional compensation may be provided to enable precise alignment of the semiconductor element 10 to other semiconductor devices with varying thickness(es). For example, dimensional compensation techniques disclosed throughout U.S. patent application Ser. No. 17/206,725, filed Mar. 19, 2021, which is incorporated by reference herein in its entirety and for all purposes, may be used to improve alignment.

FIGS. 3A-3H show a manufacturing process of manufacturing a bonded structure according to an embodiment. Unless otherwise noted, components of FIGS. 3A-3H can be the same as or generally similar to the like components disclosed herein, such as those shown in FIG. 2. In various bonding steps, the nonconductive-to-nonconductive direct bonding technique described above can be utilized. For example, such direct bonding can enable minimizing a thickness variation, room temperature, spontaneous bonding for a relatively high bonder throughput, a relatively low temperature annealing to achieve desired bond strength for processing of the bonded wafer, such as mechanical grinding and CMP. The bonded structure can sustain a relatively high process temperature (e.g., 350° C. for PECVD oxide deposition). The room temperature bonding and a low temperature annealing can be beneficial for temperature sensitive components, such as, for example, dynamic random access memory (DRAM). For products with higher temperature tolerance, the high process temperature capability allows deposition of a relatively high quality dielectric in the backside fabrication process. As will be described, the manufacturing process can include de-bonding using a photolysis layer that can enable a sensitive portion to be de-bonded with a minimized risk of being damaged.

Figure 3A:
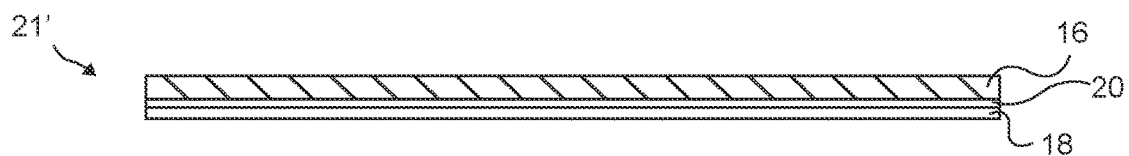
FIGS. 3A-3H show various steps in a manufacturing process of manufacturing a bonded structure according to an embodiment.
Figure 3B:
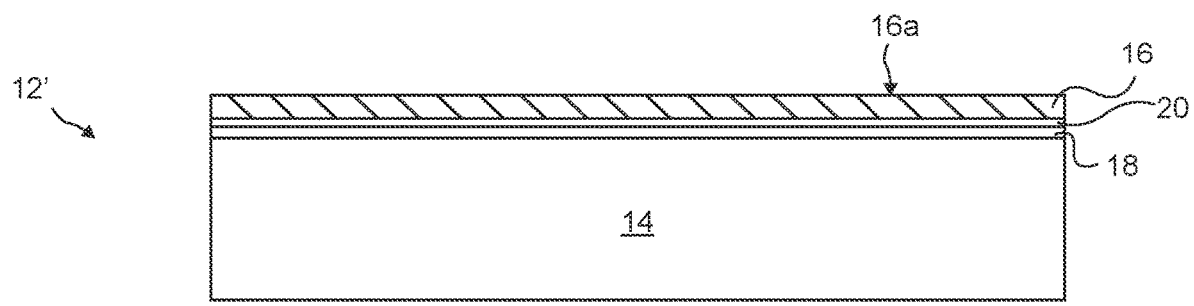

In FIG. 3A a structure with a photolysis layer 18 (e.g., a photolysis polymer layer), an opaque layer 20 (e.g., a metal layer), and a nonconductive layer 16 (e.g., a dielectric layer) can be provided. The structure of FIG. 3A can be referred to as an intervening or intermediate structure 21'. The structure of FIG. 3A can be disposed on a transparent carrier 14 (e.g., a glass carrier wafer) as shown in FIG. 3B. In some embodiments, the structure can be formed on the glass carrier wafer. In some embodiments, the structure can be formed layer-by-layer. For example, the photolysis layer 18 (e.g., the photolysis polymer layer) can be deposited on a surface of the transparent carrier 14 (e.g., the glass carrier wafer). Prior to depositing the photolysis layer 18, the transparent carrier 14 can be polished by way of, for example, chemical mechanical polishing (CMP). The photolysis layer 18 can be cured after the deposition process. The opaque layer 20 (e.g., the metal layer) can be deposited on the photolysis polymer layer 18. The nonconductive layer 16 (e.g., an oxide layer) can be deposited on the metal layer.

The photolysis layer 18 can comprise any suitable decomposition layer that can decompose in response to exposure to light. For example, the decomposition layer can decompose in response to ultraviolet (UV) light. The transparent carrier 14 can comprise any transparent support structure that is transparent to a certain range of wavelengths that can decompose decomposition layer. The opaque layer 20 can comprise any suitable blocking layer that can block at least a portion of the light. For example, the block layer can comprise a metal opaque layer. In some embodiments, the nonconductive layer 16 can comprise any suitable nonconductive layer or a bonding layer. For example, the nonconductive layer 16 can comprise an organic dielectric layer, such as silicon oxide, e.g., a low temperature oxide (LTO) layer.

As shown in FIG. 3B, the structure shown in FIG. 3A and the transparent carrier 14 can together define a carrier structure 12'. A surface 16a of the nonconductive layer 16 can be prepared for bonding. For example, the surface 16a of the nonconductive layer 16 can be prepared for direct bonding. In some embodiments, the surface 16a can have a surface roughness of less than 15 Å rms, less than 10 Å rms, or less than 5 Å rms.

Figure 3C:
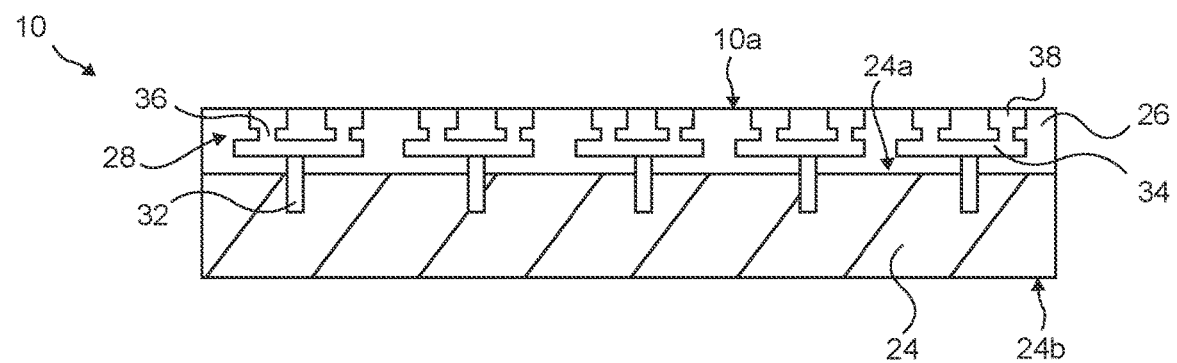

In FIG. 3C, a semiconductor element 10 can be provided. The semiconductor element 10 can include a device portion 24 and a nonconductive material 26 disposed on the device portion. The semiconductor element 10 can also include a conductive feature 28 that can comprise a through silicon via (TSV) 32 extending at least through a portion of the device portion 24 from a front side 24a and at least through a portion of the nonconductive material 26, a routing layer 34 in the nonconductive material, a via 36 in the nonconductive material, and a contact pad 38 in the nonconductive material. The TSV 32, the routing layer 34, the via 36, and the contact pad 38 can be electrically connected to one another. There can be additional TSVs (not shown) on a back side 24b of the device portion 24 opposite the front side 24a.

The conductive feature 28 can be formed in any suitable manner. In some embodiments, the conductive feature 28 can be formed by way of multiple damascene processes. For example, the routing layer 34 can be formed by way of a single damascene process, and the via 36 and the contact pad 38 can be formed by way of a dual damascene process. The conductive feature 28 can comprise copper, in some embodiments. In some embodiments, the nonconductive material 26 can comprise a standard back end of line (BEOL) dielectric. For example, the nonconductive material 26 can comprise tetraethoxysilane (TEOS), such as a 400° C. TEOS. In some embodiments, the semiconductor element 10 can have a thickness in a range of 2 um to 800 um.

Figure 3D:
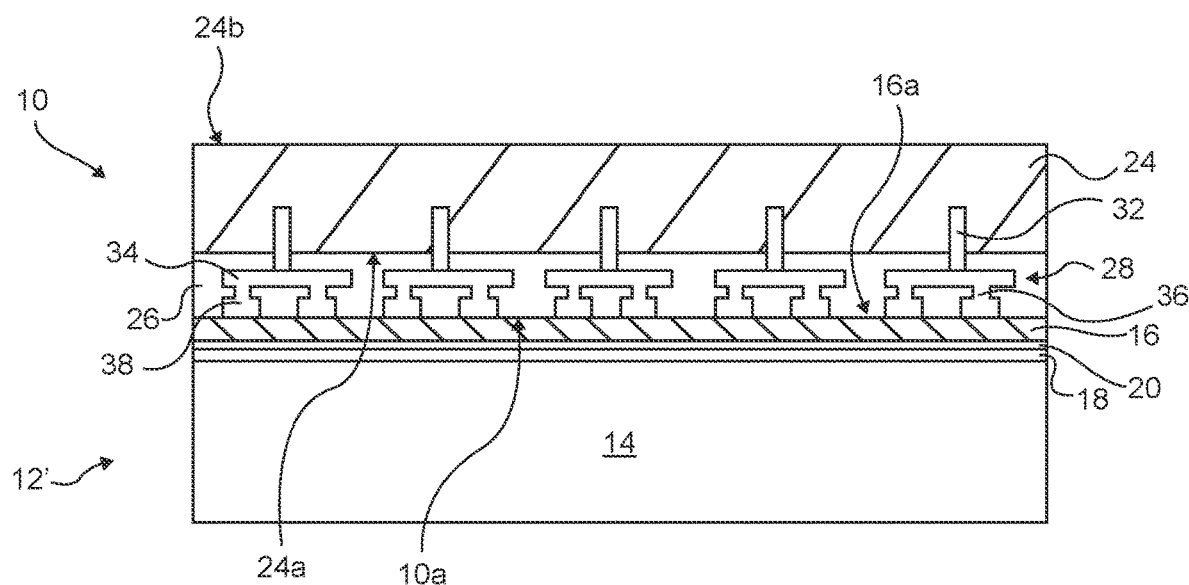

In FIG. 3D, the carrier structure 12' that includes the transparent carrier 14 (e.g., the glass carrier wafer), and an intermediate structure (the photolysis layer 18 (e.g., the photolysis polymer layer), the opaque layer 20 (e.g., the metal layer), and the nonconductive layer 16 (e.g., the oxide layer)), and the semiconductor element 10 can be coupled together. In some embodiments, the oxide layer of the intermediate layer and the nonconductive material 26 of the semiconductor element 10 can be directly bonded to one another without an intervening adhesive. The carrier structure 12' and the semiconductor device 10 can be directly bonded at room temperature. The bonded carrier structure 12' and semiconductor device 10 can be annealed at a low temperature, such as, for example, at a temperature between 50° C. and 150° C., 100° C. and 200° C., 125° C. and 200° C., 100° C. and 175° C., or 125° C. and 175° C. At least a portion of the silicon wafer can be removed (e.g., thinned) after the carrier structure 12' and the semiconductor element 10 are bonded to one another. For example, the silicon wafer can be thinned by way of grinding, CMP, and/or plasma etching to expose the TSV 32. In some embodiments, the semiconductor element 10 after thinning the silicon wafer can have a thickness of less than 100 μm, less than 50 μm, less than 10 μm, 5 μm or less, or 2 μm or less. In some embodiments, the silicon wafer can be thinned to have a total thickness variation (TTV) of 5 μm or less. In some embodiments, the silicon wafer can be thinned to have a total thickness variation (TTV) of 2 μm or less. Since the bonding surfaces between the semiconductor element 10 and the nonconductive layer 16 has sub-nm roughness prior to bonding and the bonding interface has a thickness close to zero, a thickness variation during the backside processing can be minimized. The TTV in this case is predominantly affected by a grinding process, not by the temporary bonding process.

Figure 3E:
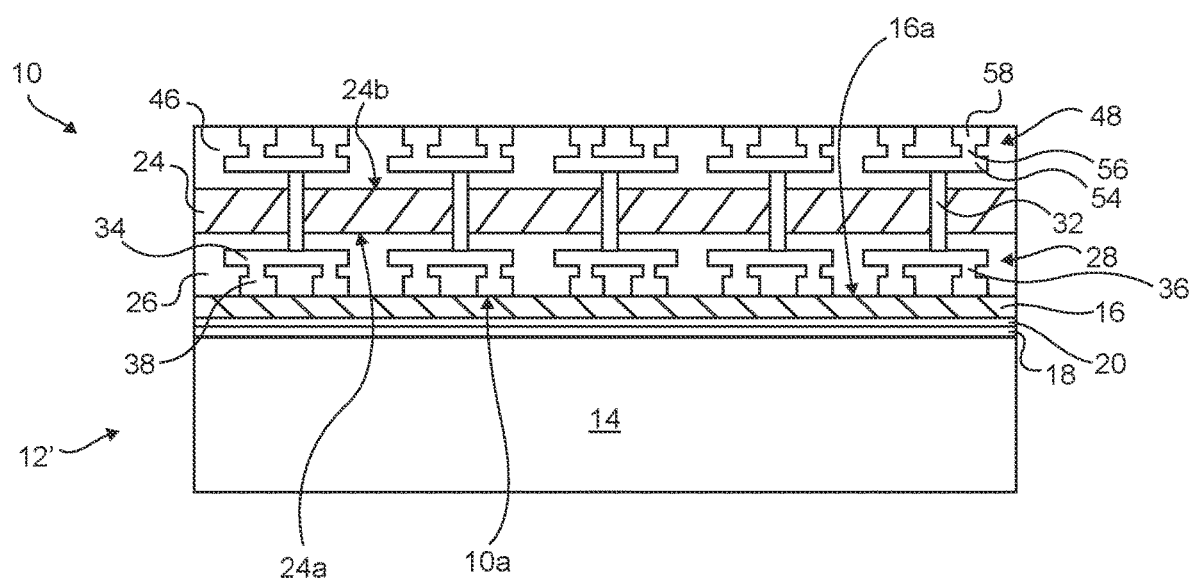

In FIG. 3E, additional nonconductive material (a nonconductive layer 46) can be formed on the thinned portion of the silicon wafer (the back side 24b of the device portion 24). In some embodiments, the back side 24b of the device portion 24 can be backgrinded, etched, and/or polished prior to forming the nonconductive layer 46. A conductive feature 48, such as an electrical interconnect structure can be formed in the nonconductive layer 46. The conductive feature 48 can include a routing layer 54, a via 56, and a contact pad 58 can be formed in the nonconductive layer 46. The conductive feature 48 can be formed in the same or similar manner as the conductive feature 28. In some embodiments, the TSV 32 can couple the conductive features 28, 48.

Figure 3F:
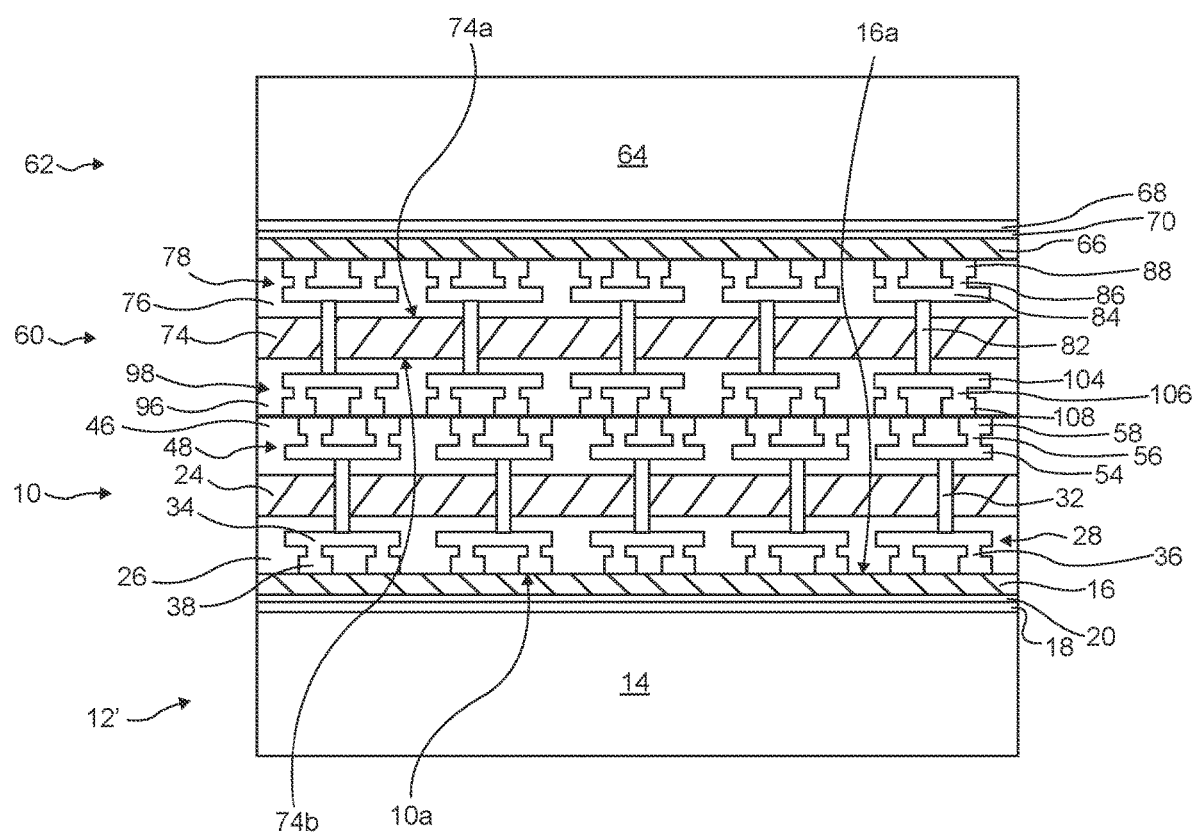

In FIG. 3F, the structure shown in FIG. 3E that includes the semiconductor element 10 and the carrier structure 12', and a structure that includes a semiconductor element 60 and a carrier structure 62 are bonded to one another to form a bonded structure. Unless otherwise noted, the components of the semiconductor element 60 and the carrier structure 62 can be the same or generally similar to the like components disclosed herein. The bonded semiconductor elements 10, 60 can define a bonded semiconductor structure. The semiconductor element 60 can include a device portion 74 having a front side 74a and a back side 74b, a nonconductive layer 76 on the front side 74a of the device portion 74, a conductive feature 78 formed in the nonconductive layer 76, a nonconductive layer 96 on the back side 74b of the device portion 74, a conductive feature 98 formed in the nonconductive layer 96, and a TSV 82 that can electrically couple the conductive features 78, 98. The conductive feature 78 can include a routing layer 84, a via 86, and a contact pad 88. The conductive feature 98 can include a routing layer 104, a via 106, and a contact pad 108. The carrier structure 62 can include a transparent carrier 64, a nonconductive layer 66, a photolysis layer 68, and an opaque layer 70.

In some embodiments, the semiconductor element 10 and the semiconductor element 60 can be directly bonded to one another without an intervening adhesive. For example, the nonconductive layer 46 and the corresponding portion(s) of the nonconductive layer 96 can be directly bonded to one another without an intervening adhesive, and the contact pad 58 can be directly bonded to the corresponding contact pad 108 without an intervening adhesive.

As with the photolysis layer 18, the photolysis layer 68 can comprise any suitable decomposition layer that can decompose in response to exposure to light. For example, the decomposition layer can decompose in response to ultraviolet (UV) light. The transparent carrier 64 can comprise any transparent support structure that is transparent to a certain range of wavelengths that can decompose the decomposition layer. The opaque layer 70 can comprise any suitable block layer that can block at least a portion of the light.

Figure 3G:
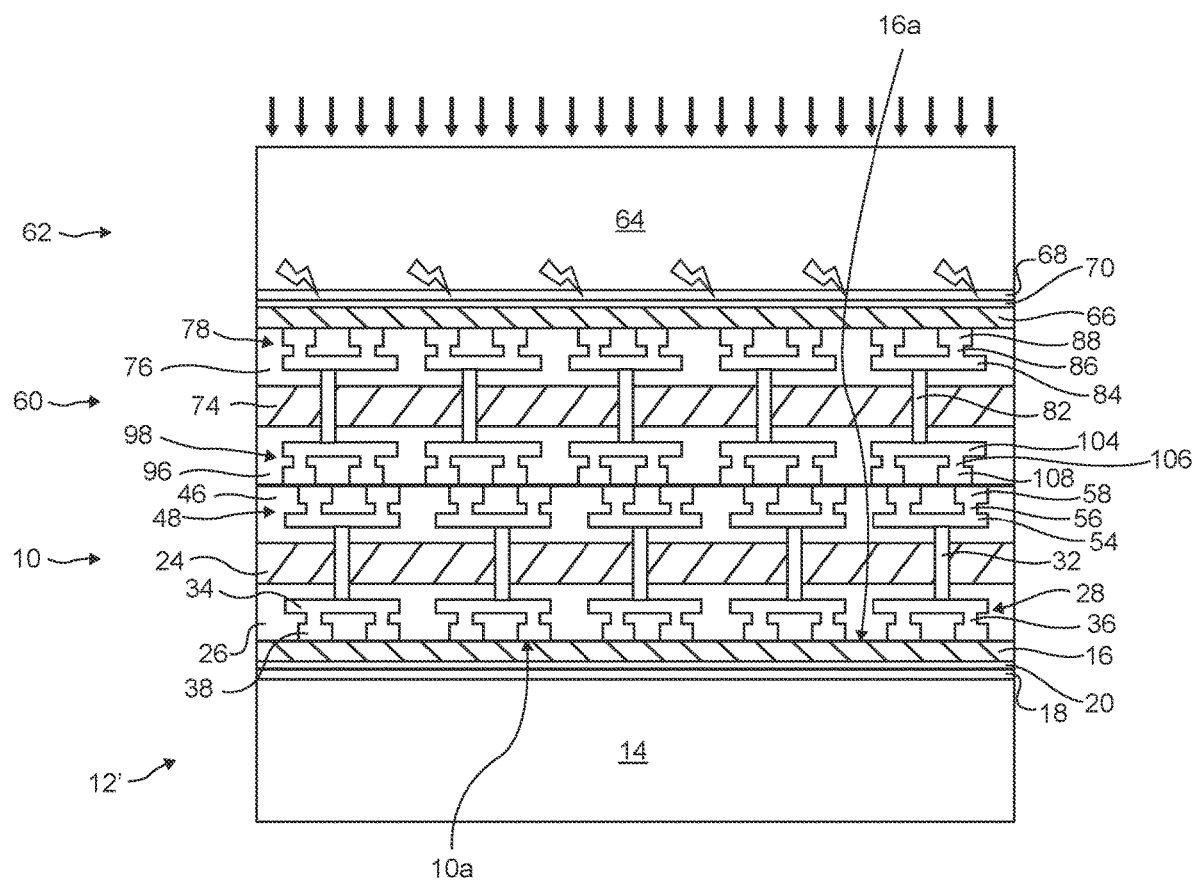
Figure 3H:
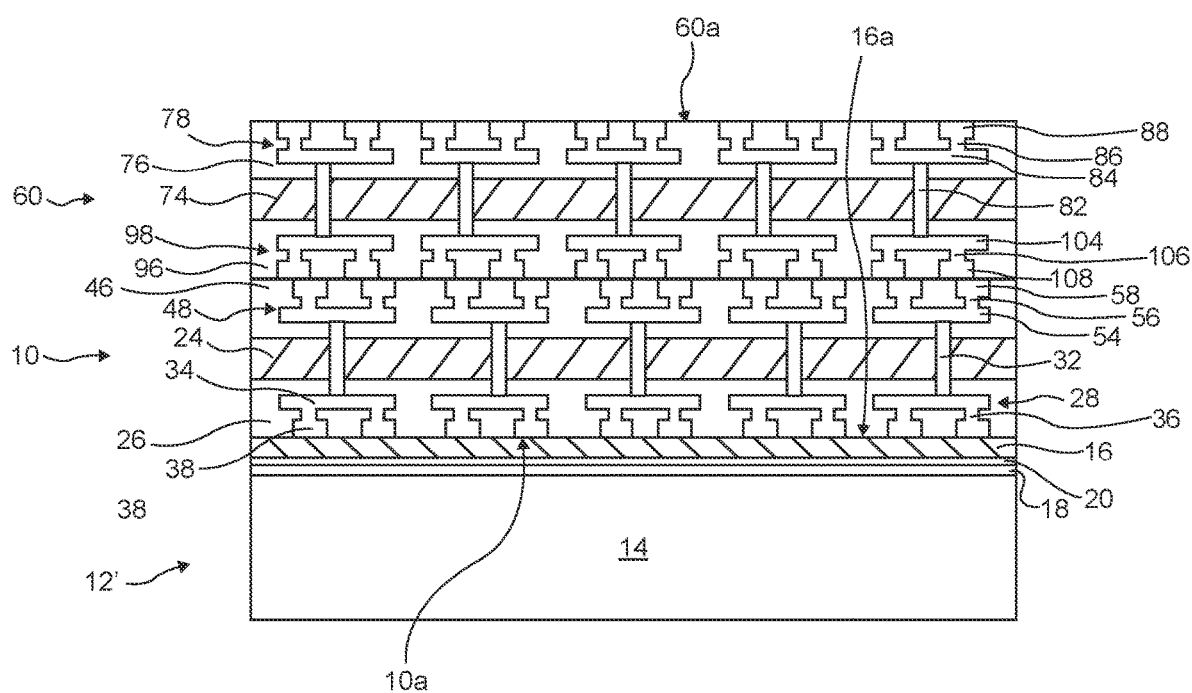

In FIGS. 3G and 3H, one of the glass carrier wafers can be removed by exposing the photolysis layer to light. For example, as shown in FIG. 3G, the photolysis layer 68 can be exposed to light (e.g., a UV light) through the transparent carrier 64. As shown in FIG. 3H, the transparent carrier 64 can be removed. The nonconductive layer 66 and the opaque layer 70 can be removed. For example, the nonconductive layer 66 and the opaque layer 70 can be removed by way of CMP. In some embodiments, a front side 60a of the semiconductor element 60 can be prepared for direct bonding. For example, the front side 60a of the semiconductor element 60 can be polished by way of CMP to a surface roughness of less than 15 Å rms, less than 10 Å rms, or less than 5 Å rms. In some embodiments, the transparent carrier 14 can be removed from the semiconductor element 10. Additional layers can be added to the bonded semiconductor element 10 and 60 by repeating process steps 3F to 3H. Additionally, although not shown, the carrier 14 can be removed by exposing the photolysis layer 18 to light (e.g., UV light).

FIGS. 4A-4F show a general process of bonding a plurality of devices (e.g., a first device 110 and a second device 114) according to an embodiment. Various embodiments of the processes disclosed herein can enable a parallel processing of, for example, wafer thinning and backside fabrication. In other words, as opposed to a sequential process that includes the wafer thinning and backside fabrication processes after bonding a wafer or a die to another wafer or die, the processes disclosed herein can bond the wafers or die after the wafer thinning and backside fabrication processes are performed on the wafers separately. Therefore, for die-to-wafer or die-to-die bonding, the processes disclosed herein can select know-good-wafer or known-good-dies prior to bonding the dies together. The wafer thinning process disclosed herein can improve yield as when a wafer is damaged during the wafer thinning process disclosed herein, only the damaged wafer is discarded, as opposed to a conventional process that uses a sequential wafer stacking process in which the entire stack of wafers is discarded when a wafer in the stack is damaged.

For example, as shown in FIG. 4A, a first device 110 can be coupled to a carrier structure 112. In FIG. 4B, the first device 110 can be processed (e.g., thinned) to define a first processed device 110'. In some embodiments, processing the first device 110 can comprise forming a bonding layer (or other back-end-of-line, BEOL, layer) on the thinned device. For example, the bonding layer can be polished in FIG. 4B to prepare the exposed surface of the device 110' for direct hybrid bonding. In parallel or sequentially, as shown in FIG. 4C, a second device 114 can be coupled to a carrier structure 116. In FIG. 4D, the second device 114 can be processed (e.g., thinned and/or provided with a bonding layer or other BEOL layer) to define a second processed device 114'. In FIG. 4E, the first processed device 110' and the second processed device 114' can be directly bonded to one another. In FIG. 4F, the carrier structures 112, 116 can be removed. Any principles and advantages disclosed herein, such as, for example, the use of a photolysis layer for de-bonding, a thinning process using CMP, and a direct bonding technique for bonding, can be implemented in one or more processes used in FIGS. 4A-4F. Additional layers can be added by repeating the process shown in FIG. 3F to 3H.

FIGS. 5A-5D show a manufacturing process of manufacturing singulated dies according to an embodiment. In some instances, the manufacturing process shown in FIGS. 5A-5D can be utilized with die-to-wafer applications.

Figure 5A:
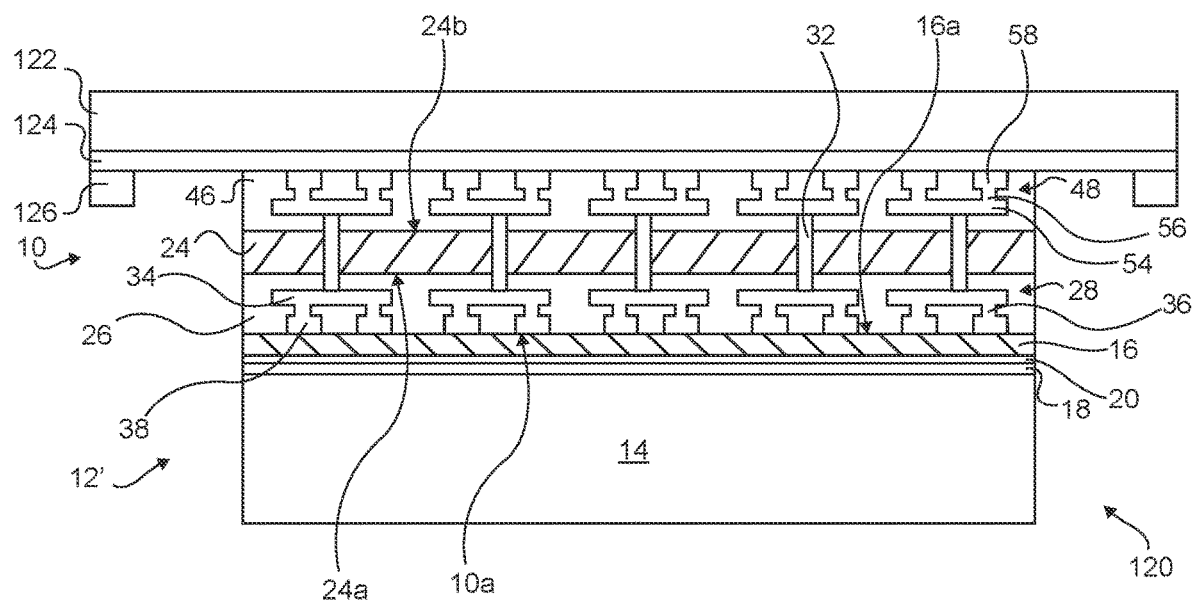
FIGS. 5A-5D show various steps in a manufacturing process of manufacturing singulated dies according to an embodiment.
Figure 5B:
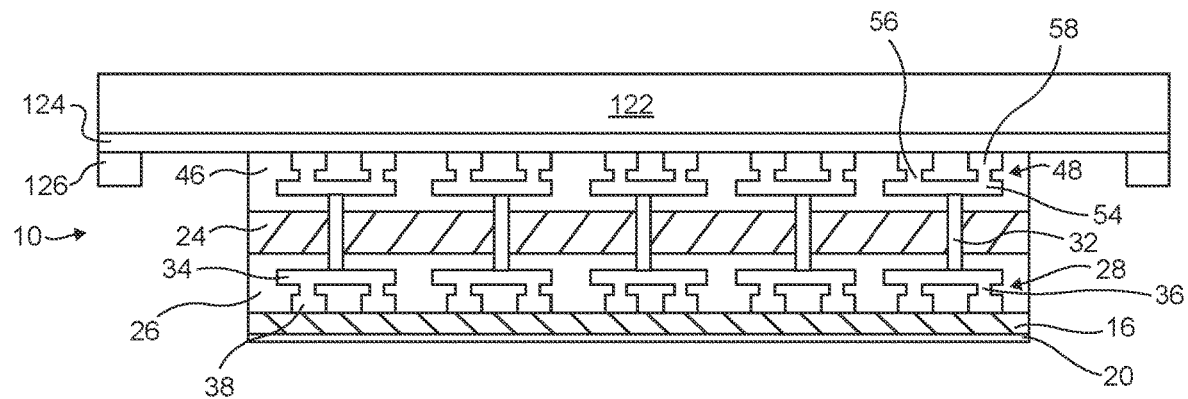
Figure 5C:
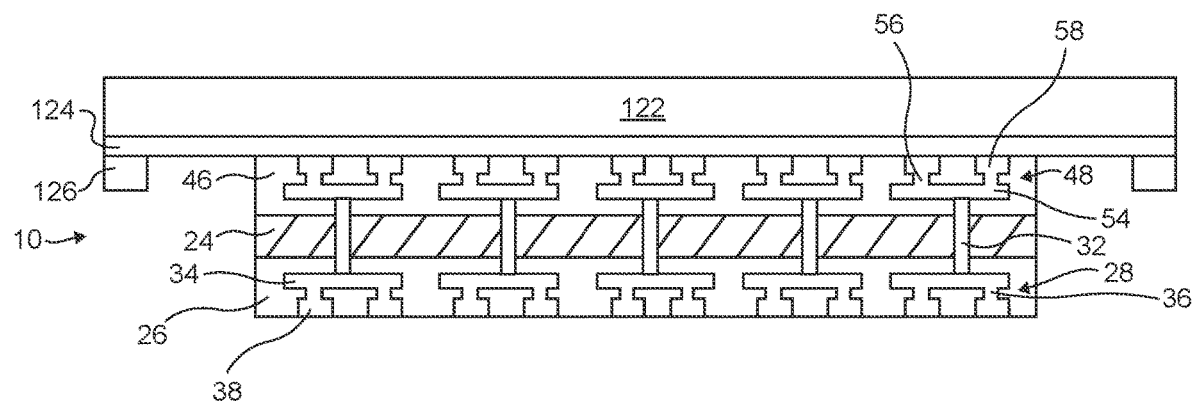
Figure 5D:
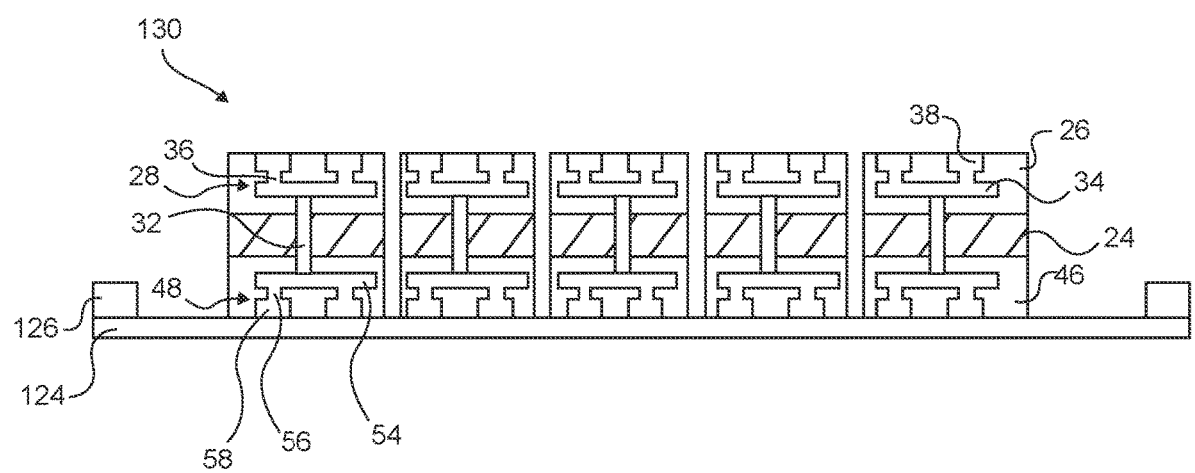

In FIG. 5A, a structure 120 the same as or similar to the structure shown in FIG. 3E is coupled with an adaptor plate 122. A dicing tape 124 can be provided between the structure and the adaptor plate 122. A dicing frame 126 can be disposed on the dicing tape 124. In some embodiments, the adaptor plate 122, the dicing tape 124, and the dicing frame 126 can be coupled together by a clamp (not shown). In FIG. 5B, the transparent carrier 14 (e.g., a glass carrier wafer) can be removed in any suitable manner as disclosed herein. In FIG. 5C, the opaque layer 20 (e.g., a metal layer) and the nonconductive layer 16 (e.g., an oxide layer) can be removed. In some embodiments, the residue of the photolysis layer 18 (e.g., a photolysis polymer layer) can be removed by way of plasma ashing. In some embodiments, the opaque layer 20 can be removed by way of wet etching. In some embodiments, the opaque layer 20 and the nonconductive layer 16 can be removed by way of chemical mechanical polishing (CMP). Other materials, such as an adhesive residue, present at or near a front side 10a of the semiconductor element 10 can be removed. For example, a polymer residue left from a temporary bonding adhesive can be cleaned by way of, for example, CMP. A portion of the nonconductive material 26 and/or a portion of the conductive feature 28 can be polished by way of CMP in preparation for direct bonding. The adaptor plate 122 can function as a support for a polishing process. After the CMP, the adaptor plate 122 can be removed. In FIG. 5D, the semiconductor element 10 can be singulated into a plurality of device dies 130. In some embodiments, the semiconductor element 10 can be singulated in to the plurality of device dies 130 by way of mechanical sawing, laser stealth dicing, or plasma dicing. In some embodiments, a protective coating can be applied to the top surface of non-conductive layer 26 and contact pad 38 to prevent contamination of the surface during sigulation. In some embodiments, the semiconductor element 10 can be singulated with the carrier structure 12'. In such embodiments, the singuation process can take place before FIG. 5D, for example, at FIG. 5A.

Figure 6A:
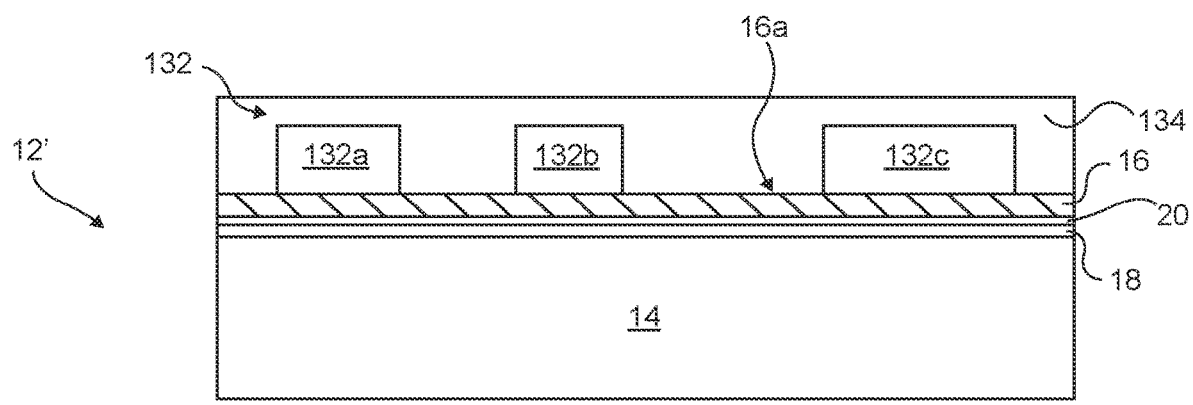
FIGS. 6A-6D show various steps in a manufacturing process of manufacturing a reconstituted wafer according to an embodiment.
Figure 6B:
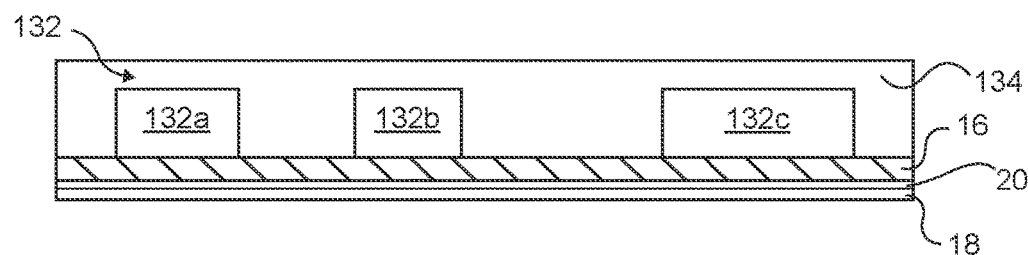
Figure 6C:
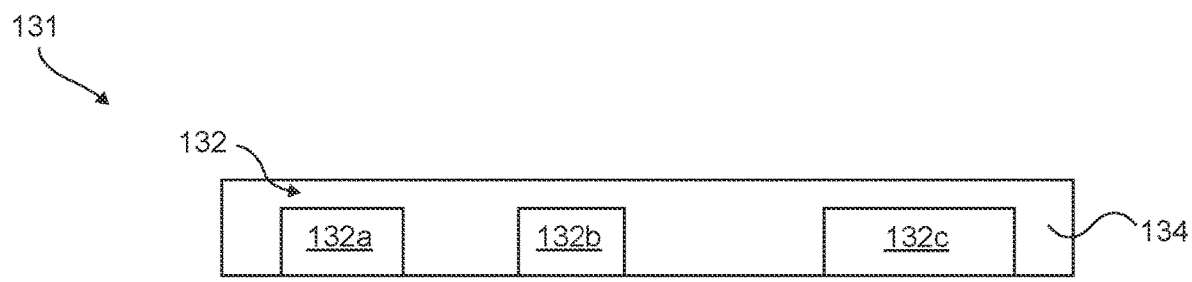

FIGS. 6A-6C show a manufacturing process of manufacturing a reconstituted wafer 131 according to an embodiment. In some instances, the manufacturing process shown in FIGS. 6A-6D can be utilized with reconstituted wafer applications.

Figure 6D:
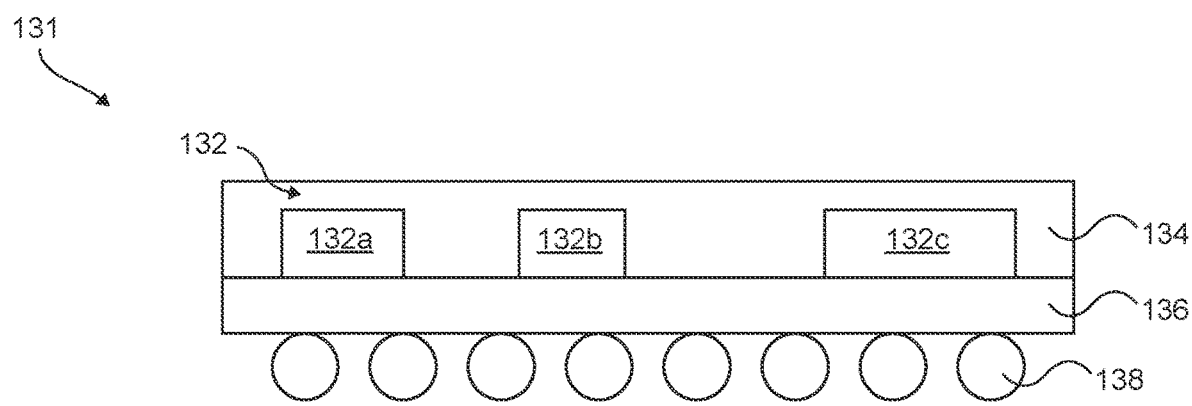

In FIG. 6A, a carrier structure 12' that comprises a transparent layer 14 (e.g., a glass carrier wafer), a photolysis layer 18 (e.g., a photolysis polymer layer), an opaque layer 20 (e.g., a meatal layer), and a nonconductive layer 16 (e.g., an oxide layer), and device dies 132 mounted on the oxide layer of the carrier structure is shown. For example, as shown in FIG. 6A, a first die 132a, a second die 132b, and a third die 132c can be mounted on the nonconductive layer 16. The first to third dies 132a-132c can be directly bonded to the nonconductive layer 16 without an intervening adhesive. A molding material 134 can be provided over the oxide layer and about the device dies 132a-132c. The device dies 132a-132c can be bonded to the oxide layer so as to prevent or mitigate the device dies 132a-132c from shifting during the molding process. The device die 132a-132c can comprise a semiconductor element that includes a nonconductive material that is disposed on a device portion. In FIG. 6B, the transparent carrier 14 (the glass carrier wafer) can be removed in any suitable manner disclosed herein. In FIG. 6C, the nonconductive layer 16 (the oxide layer), the opaque layer 20 (the metal layer), and a residue of the photolysis layer 18 (the photolysis polymer layer) can be removed in any suitable manner disclosed herein. The structure shown in FIG. 6C can comprise the reconstituted wafer 131. As shown in FIG. 6D, a redistribution layer (RDL) 136 and electrical contact pads (e.g., which can connect to solder balls 138) can be provided to the reconstituted wafer 131. The RDL 136 can comprise a plurality of layers with an electrical routing structure (not shown). The RDL 136 can have lateral traces to provide electrical communication between any or all of the dies 132a-132c, and/or to provide electrical communication between the dies 132a-132c and the solder balls 138. The reconstituted wafer 131 can be electrically connected to an external device, system, or substrate (not shown) through the RDL 136 and the solder balls 138. In some embodiments, the reconstituted wafer 131 can be diced. Any carrier structure disclosed herein, such as the carrier structures 12, 12", can be used in place of the carrier structure 12'.

FIGS. 7A-7H show a manufacturing process of manufacturing singulated dies according to another embodiment. The manufacturing process of FIGS. 7A-7H can be generally similar to the manufacturing process of FIGS. 3A-3H. Unless otherwise noted, components of FIGS. 7A-7H can be the same or generally similar to like components discussed herein, such as those shown in FIGS. 3A-3H.

Figure 7A:
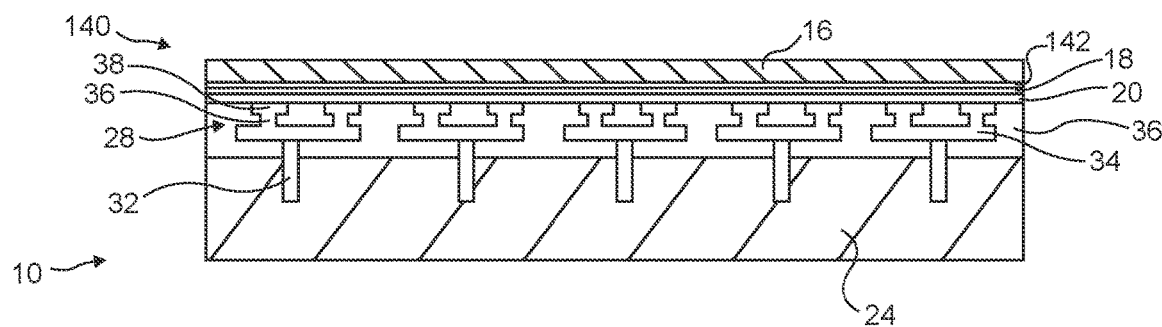
FIGS. 7A-7H show carious steps in a manufacturing process of manufacturing singulated dies according to another embodiment.

In FIG. 7A, a semiconductor element 10 and an intervening or intermediate structure 140 on the semiconductor element 10 can be provided. The semiconductor element 10 of FIG. 7A can be identical to or similar to the semiconductor element 10 shown in FIG. 3C. The intermediate structure 140 of FIG. 7A can include a nonconductive layer 16, a photolysis layer 18, an opaque blocking layer 20, and an adhesion layer 142. The opaque layer 20 can comprise a metal layer (e.g., a titanium or tungsten layer), the photolysis layer 18 can comprise a photolysis polymer layer, and the nonconductive layer 16 can comprise a dielectric layer (e.g., a silicon oxide layer, such as, for example, a low temperature oxide (LTO) layer, a plasma enhanced chemical vapor deposition (PECVD) oxide layer, etc.). Using the LTO layer for the nonconductive layer 16 can be beneficial when the semiconductor element 10 includes a temperature sensitive element, such as a dynamic random access memory (DRAM). The formation of the LTO layer can occur at a temperature lower than 200° C. The intermediate structure 140 of FIG. 7A can have similar structure and/or materials as the intervening or intermediate structure disclosed herein.

In some embodiments, the intermediate structure 140 can be formed on the semiconductor element 10. For example, the metal layer can be deposited on the semiconductor element 10. The photolysis polymer layer can be deposited on the metal layer. The adhesion layer 142 (e.g., a nitride layer) can be deposited on the photolysis polymer layer. The LTO layer can be deposited on the adhesion layer 142.

Figure 7B:
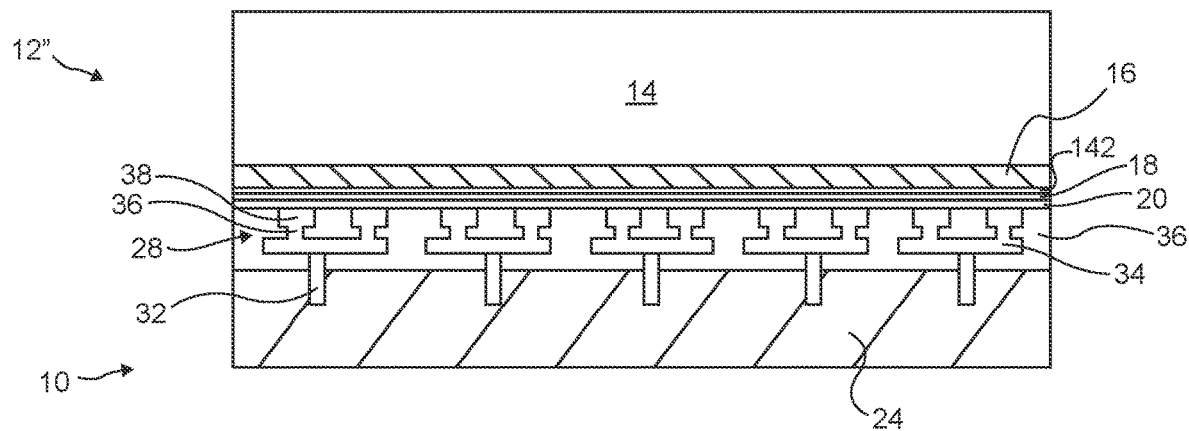
Figure 7C:
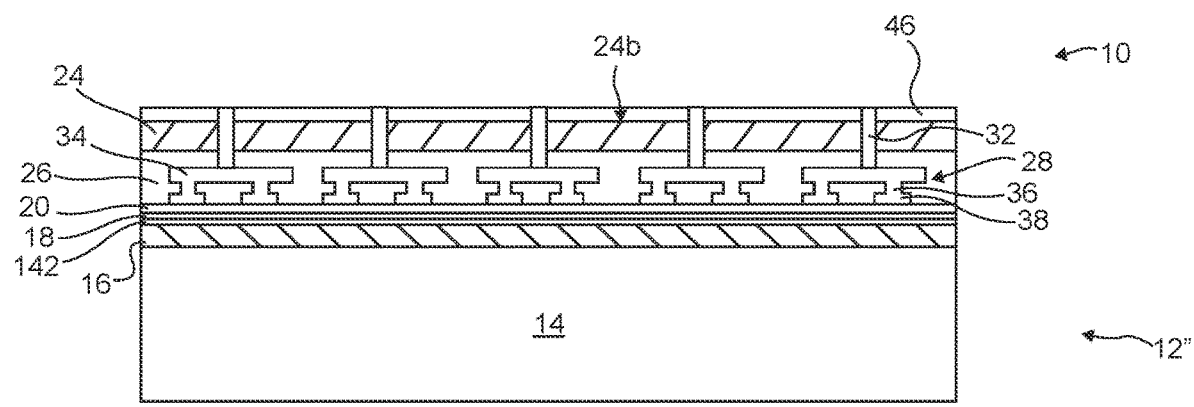
Figure 7D:
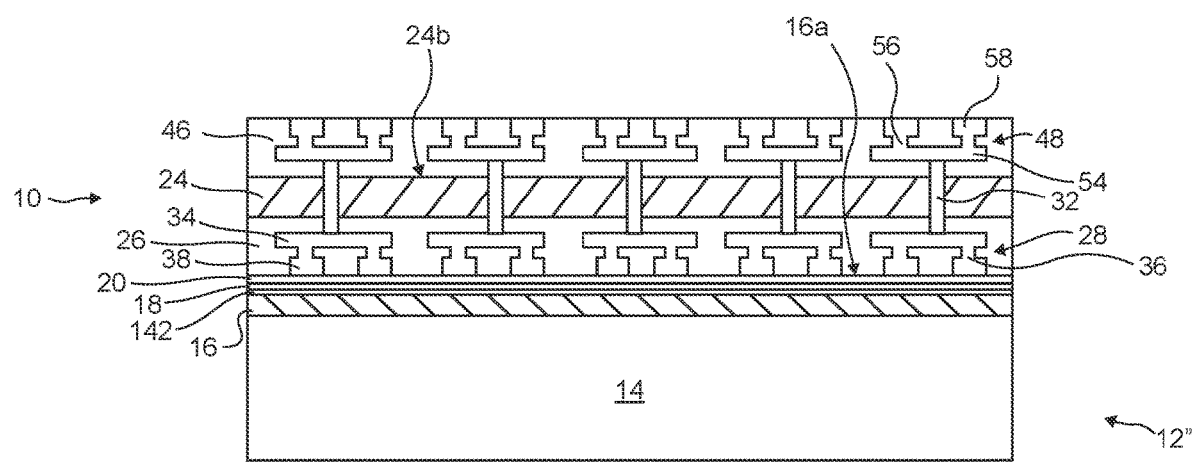

In FIG. 7B, a transparent carrier 14 (e.g., a glass carrier wafer) can be bonded to the nonconductive layer 16 (e.g., the LTO layer). The intermediate structure 140 and the transparent carrier 14 can together define a carrier structure 12". In some embodiments, the glass carrier wafer can be directly bonded to the LTO layer without an intervening adhesive. For example, the transparent carrier 14 and the nonconductive layer 16 can be directly bonded to one another at room temperature. The bonded transparent carrier 14 and the nonconductive layer 16 can be annealed at a low temperature, such as, for example, at a temperature between 50° C. and 150° C., 100° C. and 200° C., 125° C. and 200° C., 100° C. and 175° C., or 125° C. and 175° C. In FIG. 7C, the semiconductor element 10 can be processed to expose TSVs 32. In some embodiments, a nonconductive layer 46 can be formed on a back side 24b of a device portion 24 of the semiconductor element 10. The nonconductive layer 46 can be prepared for direct bonding. In FIG. 7D, the semiconductor element 10 can be processed to form a routing layer 54, a via 56, and a contact pad 58. The processes shown in FIGS. 7C and 7D can be similar to the process described with respect to, for example, FIG. 3E.

Figure 7E:
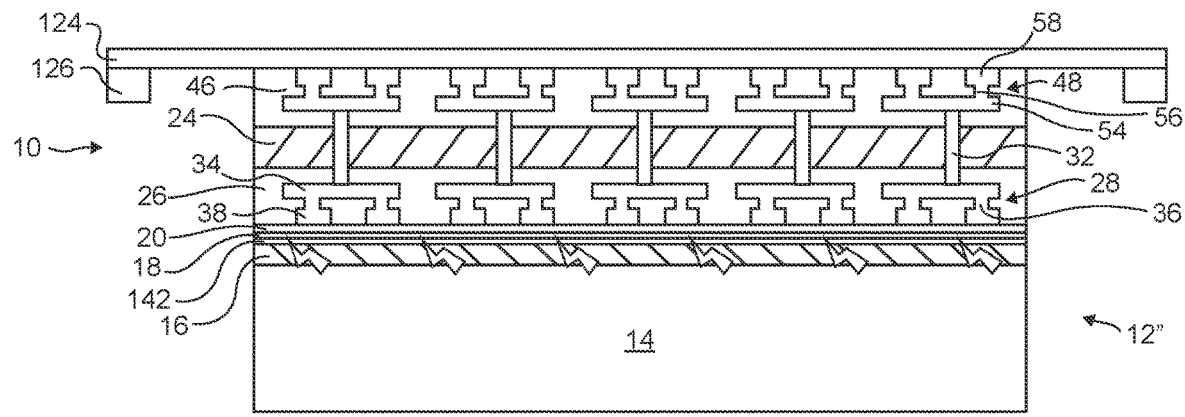
Figure 7F:
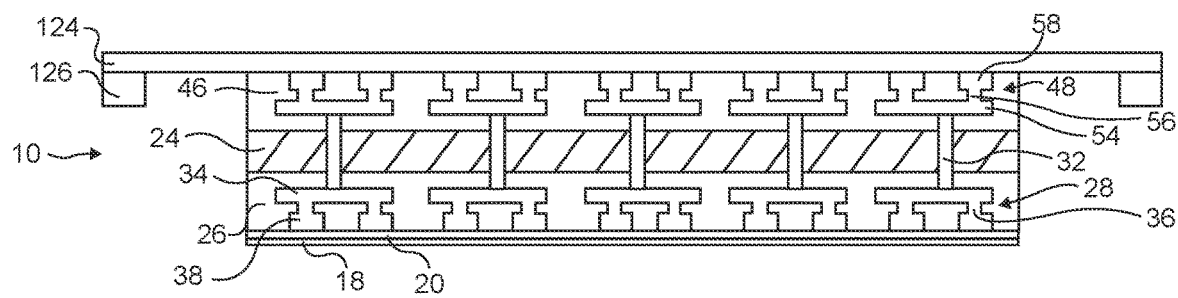
Figure 7G:
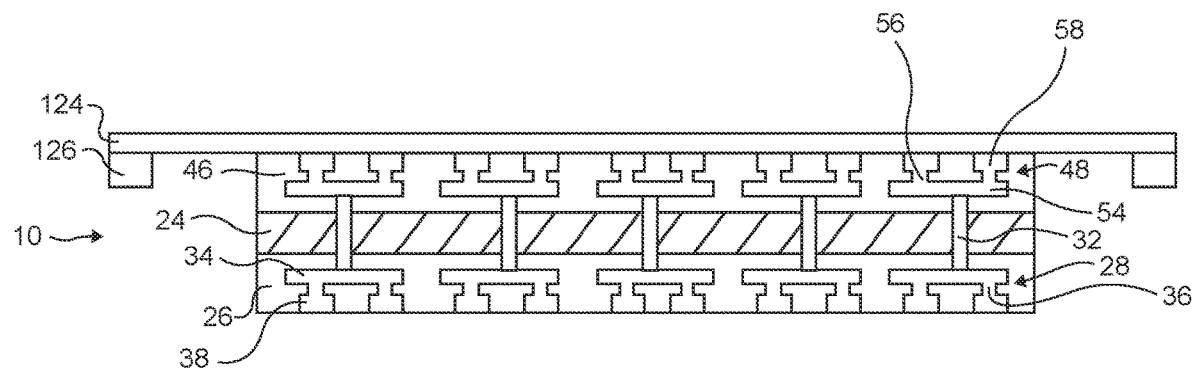
Figure 7H:
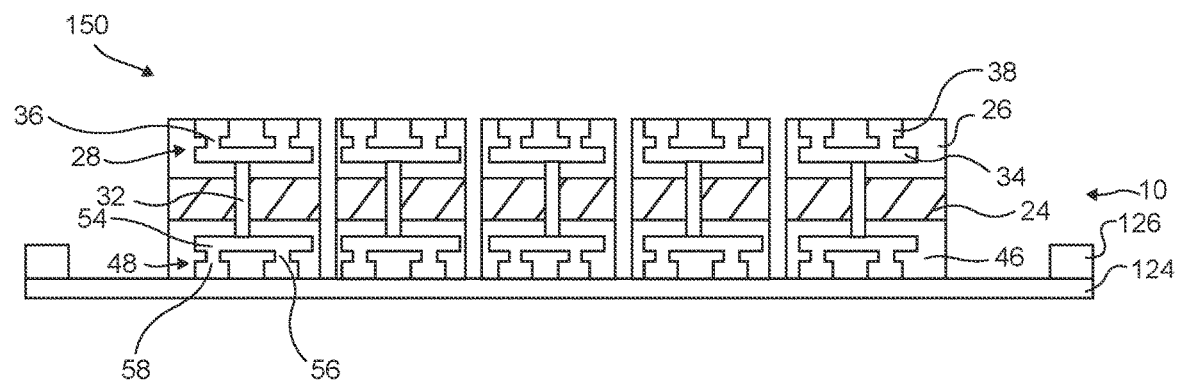

In FIG. 7E, the semiconductor element 10 can be mounted on a dicing tape 124. In FIG. 7F, the transparent carrier 14 (e.g., the glass carrier wafer) can be removed. The glass carrier wafer can be removed in any suitable manner disclosed herein. In FIG. 7G, a residue of the photolysis layer 18 (e.g., the photolysis polymer layer), and the opaque layer 20 (e.g., the metal layer) can be removed. In some embodiments, the residue of the photolysis polymer layer can be removed by way of plasma ashing. In some embodiments, the metal layer can be removed by way of wet etching. In FIG. 7H, the semiconductor element 10 can be singulated into a plurality of device dies 150. In some embodiments, the semiconductor element 10 can be singulated into the plurality of device dies 150 by way of mechanical sawing, laser stealth dicing, or plasma dicing. In some embodiments, a protective coating can be applied to the top surface of non-conductive layer 26 and contact pad 38 to prevent contamination of the surface during sigulation.

In one aspect, a method of processing a semiconductor element is disclosed. The method can include providing the semiconductor element. The semiconductor element has a first nonconductive material. The first nonconductive material is disposed on a device portion of the semiconductor element. The method can include providing a transparent carrier. The method can include providing an intervening structure that has a second nonconductive material, a photolysis layer, and an opaque layer stacked together. The method can include forming a bonded structure such that the second nonconductive material is directly bonded to the first nonconductive material or to the transparent carrier. The intervening structure is disposed between the semiconductor element and the transparent carrier. The method can include decoupling the transparent carrier from the semiconductor element by exposing the photolysis layer to light through the transparent carrier such that the light decomposes the photolysis layer.

In one embodiment, the method further includes processing the semiconductor element after forming the bonded structure and before decoupling the transparent carrier from the semiconductor element. The processing can include polishing a portion of the semiconductor element by way of chemical mechanical polishing. The processing can include forming a nonconductive layer such that the device portion of the semiconductor element is disposed between the first nonconductive material and the nonconductive layer, and forming a conductive feature in or with the nonconductive layer.

In one embodiment, the opaque layer is disposed between the second nonconductive material and the photolysis layer, the method comprising directly bonding the second nonconductive material to the first nonconductive material. The intervening structure can be disposed on the transparent carrier prior to the bonding.

In one embodiment, the photolysis layer is disposed between the second nonconductive material and the opaque layer. The opaque layer can be deposited on the first nonconductive material of the semiconductor element, prior to the bonding. The intervening structure can further comprise an adhesion layer between the second nonconductive material and the photolysis layer.

In one embodiment, the light includes a UV light. The UV light can include a UV laser.

In one embodiment, the photolysis layer includes a photolysis polymer layer.

In one embodiment, the opaque layer includes a metal layer. A surface of the metal layer that faces the transparent layer can include a reflective surface. The metal layer can include titanium. The metal layer can have a thickness in a range of 20 nm to 100 nm.

In one embodiment, the method further includes removing a portion of the semiconductor element from a side of the semiconductor element that faces away the transparent layer. The removing can include grinding, wet chemical etching, dry etching, plasma etching, or polishing. The removing can include thinning the semiconductor element to a thickness of less than 100 µm. The removing can include thinning the semiconductor element to a thickness of less than 50 µm. The removing can include thinning the semiconductor element to a thickness of less than 10 µm. The removing can include thinning the semiconductor element to have a total thickness variation of 5 µm or less. The removing can include thinning the semiconductor element to have a total thickness variation of 2 µm or less.

In one embodiment, the method further includes directly bonding a second semiconductor element to the semiconductor element such that the semiconductor element is disposed between the intervening layer and the second semiconductor element. The directly bonding can include directly bonding the first nonconductive material to a third nonconductive material of the second semiconductor element, and directly bonding a first conductive feature of the semiconductor element to a second conductive feature of the second semiconductor element. The method can further include directly bonding a second intervening layer to the second semiconductor element and bonding a second transparent layer to the intervening layer such that the intervening layer is disposed between the second semiconductor element and the second transparent layer. The decoupling can be performed after the directly bonding the second semiconductor element to the semiconductor element.

In one embodiment, the method further includes bonding the semiconductor element to a dicing frame such that the semiconductor element is disposed between the transparent carrier and the dicing frame. The method can further includes singulating the semiconductor element into a plurality of singulated integrated device dies. The semiconductor element can include a semiconductor wafer.

In one embodiment, the first nonconductive material includes a dielectric layer. The second nonconductive material can include a silicon oxide layer.

In one embodiment, the transparent layer includes a glass carrier wafer.

In one embodiment, the method further includes removing the opaque layer.

In one embodiment, the photolysis layer has a thickness in a range of 100 nm to 1 µm. The photolysis layer can have the thickness in a range of 100 nm to 500 nm.

In one embodiment, the method further includes coupling the semiconductor element to an adaptor plate, and removing the second nonconductive material. The semiconductor element and the adaptor plate can be coupled after forming the bonded structure, and the second nonconductive material can be removed after decoupling the transparent carrier from the semiconductor element. The method can further include, after removing the second nonconductive material, polishing the semiconductor element for direct bonding by way of chemical mechanical polishing.

In one aspect, a carrier structure for temporal bonding is disclosed. The carrier can include a transparent carrier, a photolysis layer over the transparent carrier, an opaque layer over the photolysis layer, and a nonconductive layer having a first side and a second side. The first side is disposed on the opaque layer and the second side is prepared for direct bonding to a semiconductor element.

In one embodiment, the transparent carrier includes a glass carrier.

In one embodiment, the photolysis layer includes a ultraviolet (UV) photolysis polymer layer.

In one embodiment, the photolysis layer is a deposited layer.

In one embodiment, the photolysis layer has a thickness in a range of 100 nm to 1 µm. The photolysis layer has the thickness in a range of 100 nm to 500 nm.

In one embodiment, the opaque layer includes a metal layer. A surface of the metal layer that faces the transparent layer can include a reflective surface. The metal layer can include titanium. The metal layer can have a thickness in a range of 20 nm to 100 nm.

In one embodiment, the opaque layer is a deposited layer.

In one embodiment, the nonconductive layer includes a silicon oxide layer.

In one embodiment, the nonconductive layer is a deposited layer.

In one aspect, a method of manufacture of an electronic component is disclosed. The method can include providing a bonded structure on a dicing tape. The bonded structure includes a semiconductor element that has a device portion, a transparent carrier that is coupled to the semiconductor element, and an intermediate structure between the semiconductor element and the transparent carrier. The intermediate structure includes a photolysis layer. The semiconductor element has a first side facing the dicing tape and a second side facing the transparent carrier. The method can include decoupling the transparent carrier from the semiconductor element by subjecting the photolysis layer to light through the transparent carrier such that the light decomposes the photolysis layer. The method can include polishing the semiconductor element from the second side after the decoupling.

In one embodiment, the semiconductor element is polished from the second side while the semiconductor element is bonded to the dicing tape.

In one embodiment, polishing the semiconductor element includes removing an adhesion residue.

In one embodiment, the method further includes, before providing the bonded structure on the dicing tape, processing the semiconductor element. Processing the semiconductor element can include coupling the semiconductor element and the transparent carrier, and processing the semiconductor element to define the first side of the semiconductor element. The processing the semiconductor element can include thinning the semiconductor element and fabricating a conductive structure at or near the first side of the semiconductor element while the semiconductor element and the transparent carrier are coupled.

In one embodiment, the method further includes singulating a die from the semiconductor element. The singulating includes sawing, stealth dicing, or plasma dicing.

In one embodiment, the method further includes removing a residue of the photolysis layer by way of plasma ashing after the transparent carrier is removed.

In one embodiment, the intermediate structure further includes an opaque layer disposed between the semiconductor element and the photolysis layer. The method can further includes removing the opaque layer by way of selective etching after the transparent carrier is removed.

In one aspect, a bonded structure is disclosed. The bonded structure can include a semiconductor element that has a first nonconductive material. The first nonconductive material is disposed on a device portion of the semiconductor element. The bonded structure can include an opaque layer over the first nonconductive material, a photolysis layer over the opaque layer, and a second nonconductive layer over the photolysis layer. The second nonconductive layer has a first side disposed on the photolysis layer and a second side opposite the first side. The second side is prepared for direct bonding to another element.

In one embodiment, the semiconductor element includes a silicon device wafer.

In one embodiment, the semiconductor element has a thickness of less than 100 µm, less than 50 µm, or less than 10 µm.

In one embodiment, the bonded structure further includes a transparent carrier that is bonded to the second side of the second nonconductive layer. The transparent carrier can include a glass carrier.

In one embodiment, the photolysis layer includes a ultraviolet (UV) photolysis polymer layer.

In one embodiment, the photolysis layer is a deposited layer.

In one embodiment, the photolysis layer has a thickness in a range of 100 nm to 1 µm.

In one embodiment, the opaque layer includes a metal layer. A surface of the metal layer that faces the transparent layer can include a reflective surface. The metal layer can include titanium.

In one embodiment, the metal layer has a thickness in a range of 20 nm to 100 nm.

In one embodiment, the opaque layer is a deposited layer.

In one embodiment, the second nonconductive layer includes a silicon oxide layer.

In one embodiment, the second nonconductive layer is a deposited layer.

In one embodiment, the bonded structure further includes an adhesion layer between the photolysis layer and the second nonconductive layer.

In one aspect, a method of forming a debondable structure that has a semiconductor element, a transparent carrier, and an intervening structure between the semiconductor element and the transparent carrier is disclosed. The semiconductor element has a first nonconductive material that is disposed on a device portion of the semiconductor element. The intervening structure includes a second nonconductive material, a photolysis layer and an opaque layer. The method can include forming a bonded structure such that the second nonconductive material is directly bonded to the first nonconductive material or to the transparent carrier. The intervening structure is disposed between the semiconductor element and the transparent carrier. The photolysis layer is configured to decompose in response to exposure to light.

In one aspect, a method of processing a semiconductor element is disclosed. The method can include providing a carrier structure that has a first side and a second side opposite the first side. The carrier structure includes a transparent carrier positioned closer to the first side than to the second side. A photolysis layer positioned between the transparent carrier and the second side. The method can include bonding a device die to the second side of the carrier structure, providing a molding material at least partially over the device die, and removing the transparent carrier by exposing the photolysis layer to light through the transparent carrier such that the light decomposes the photolysis layer.

In one embodiment, the carrier structure further includes a nonconductive layer that at least partially defines the second side. The device dies can be directly bonded to the nonconductive layer without an intervening adhesive. The transparent carrier can at least partially define the first side of the carrier structure. The carrier structure further includes an opaque layer between the photolysis layer and the nonconductive layer. The method can further include, after removing the transparent carrier, removing the opaque layer and the nonconductive layer to thereby form a reconstituted wafer. The method can further include forming a redistribution layer on the reconstituted wafer.

In one aspect, a method of processing a semiconductor element is disclosed. the method can include providing a first bonded structure that has a first semiconductor element on a first carrier structure. The first semiconductor element has a first side on the first carrier structure and a second side opposite the first side. The method can include thinning the first semiconductor element from the second side of the first semiconductor element while the first semiconductor element is on the first carrier structure. The method can include providing a second bonded structure that has a second semiconductor element on a second carrier structure. The second semiconductor element has a first side on the second carrier structure and a second side opposite the second side. The method can include directly bonding the second side of the first semiconductor element to the second side of the second semiconductor element while the first semiconductor element is on the first carrier structure and while the second semiconductor element is on the second carrier structure to form a bonded semiconductor structure. The method can include after the directly bonding, removing at least one of the first and second carrier structures from the bonded structure.

In one embodiment, the method further includes thinning the second semiconductor element from the second side of the semiconductor element while the second semiconductor element is on the second carrier structure.

In one embodiment, removing at least one of the first and second carrier structures includes exposing a photolysis layer to light.

In one embodiment, the method further includes processing the second side of the first semiconductor element while the first semiconductor element is on the first carrier structure. The processing the second side of the first semiconductor element can include forming a bonding layer on the second side of the first semiconductor element after thinning the first semiconductor element. The forming the bonding layer can include forming a nonconductive bonding region and a plurality of contact pads at least partially embedded in the nonconductive bonding region.

In one embodiment, the first carrier structure includes a transparent carrier and an intermediate structure over the transparent carrier. The intermediate structure can include a nonconductive layer, a photolysis layer, and an opaque layer.

In one aspect, a method of manufacture of an electronic is disclosed. The method can include providing a semiconductor element on a dicing tape. The semiconductor element has a device portion and an adhesion residue from decoupling a carrier structure from the semiconductor element. The semiconductor element has a first side facing the dicing tape and a second side that has the residue. The method can include polishing the semiconductor element from the second side to remove the residue while the semiconductor element is disposed on the dicing tape.

In one embodiment, the method further includes bonding the semiconductor element to the carrier structure. The carrier structure can include a transparent carrier and an intermediate structure between the semiconductor element and the transparent carrier. The intermediate structure can include a photolysis layer. The intermediate structure can further include an opaque layer and a dielectric layer.

In one embodiment, the adhesion residue includes residue of a photolysis layer of the carrier structure.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A method of processing a semiconductor element comprising:
   providing the semiconductor element having a first nonconductive material, the first nonconductive material disposed on a device portion of the semiconductor element;
   providing a transparent carrier;
   providing an intervening structure having a second nonconductive material, a photolysis layer, and an opaque layer stacked together;
   forming a bonded structure such that the second nonconductive material is directly bonded to the first nonconductive material or to the transparent carrier, the intervening structure being disposed between the semiconductor element and the transparent carrier; and
   decoupling the transparent carrier from the semiconductor element by exposing the photolysis layer to light through the transparent carrier such that the light decomposes the photolysis layer.

2. The method of claim 1, further comprising processing the semiconductor element after forming the bonded structure and before decoupling the transparent carrier from the semiconductor element, the processing includes polishing a portion of the semiconductor element by way of chemical mechanical polishing.

3. The method of claim 2, wherein the processing includes forming a nonconductive layer such that the device portion of the semiconductor element is disposed between the first nonconductive material and the nonconductive layer, and forming a conductive feature in or with the nonconductive layer.

4. The method of claim 1, wherein the opaque layer is disposed between the second nonconductive material and the photolysis layer, the method comprising directly bonding the second nonconductive material to the first nonconductive material.

5. The method of claim 4, wherein the intervening structure is disposed on the transparent carrier prior to the bonding.

6. The method of claim 1, wherein the photolysis layer is disposed between the second nonconductive material and the opaque layer.

7. The method of claim 6, wherein the intervening structure further comprises an adhesion layer between the second nonconductive material and the photolysis layer.

8. The method of claim 1, wherein the light comprises a UV laser.

9. The method of claim 1, wherein the photolysis layer comprises a photolysis polymer layer.

10. The method of claim 1, wherein the opaque layer comprises a metal layer.

11. The method of claim 10, wherein a surface of the metal layer that faces the transparent layer comprises a reflective surface.

12. The method of claim 10, wherein the metal layer comprises titanium, and the metal layer has a thickness in a range of 20 nm to 100 nm.

13. The method of claim 1, further comprising removing a portion of the semiconductor element from a side of the semiconductor element that faces away the transparent layer, the removing comprises grinding, wet chemical etching, dry etching, plasma etching, or polishing.

14. The method of claim 13, wherein the removing comprises thinning the semiconductor element to a thickness of less than 100 µm, and to have a total thickness variation of 5 µm or less.

15. The method of claim 1, further comprising directly bonding a second semiconductor element to the semiconductor element such that the semiconductor element is disposed between the intervening layer and the second semiconductor element.

16. The method of claim 15, wherein the directly bonding comprises directly bonding the first nonconductive material to a third nonconductive material of the second semiconductor element, and directly bonding a first conductive feature of the semiconductor element to a second conductive feature of the second semiconductor element.

17. The method of claim 15, further comprising directly bonding a second intervening layer to the second semiconductor element and bonding a second transparent layer to the intervening layer such that the intervening layer is disposed between the second semiconductor element and the second transparent layer.

18. The method of claim 1 further comprising bonding the semiconductor element to a dicing frame such that the semiconductor element is disposed between the transparent carrier and the dicing frame, singulating the semiconductor element into a plurality of singulated integrated device dies, wherein the semiconductor element comprises a semiconductor wafer.

19. The method of claim 1, wherein the first nonconductive material comprises a dielectric layer, the second nonconductive material comprises a silicon oxide layer, and the transparent layer comprises a glass carrier wafer.

20. The method of claim 1, further comprising removing the opaque layer.

21. The method of claim 1, wherein the photolysis layer has a thickness in a range of 100 nm to 1 µm.

22. The method of claim 1, further comprising coupling the semiconductor element to an adaptor plate, and removing the second nonconductive material, wherein the semiconductor element and the adaptor plate are coupled after forming the bonded structure, and the second nonconductive material is removed after decoupling the transparent carrier from the semiconductor element.

23. The method of claim 22, further comprising, after removing the second nonconductive material, polishing the semiconductor element for direct bonding by way of chemical mechanical polishing.

24. A method of processing a semiconductor element comprising:
providing a carrier structure having a first side and a second side opposite the first side, the carrier structure including a transparent carrier positioned closer to the first side than to the second side and a photolysis layer positioned between the transparent carrier and the second side;
bonding a device die to the second side of the carrier structure;
providing a molding material at least partially over the device die; and
removing the transparent carrier by exposing the photolysis layer to light through the transparent carrier such that the light decomposes the photolysis layer.

25. The method of claim 24, wherein the carrier structure further including a nonconductive layer that at least partially defines the second side and an opaque layer between the photolysis layer and the nonconductive layer wherein the device dies are directly bonded to the nonconductive layer without an intervening adhesive, the transparent carrier at least partially defines the first side of the carrier structure.

26. The method of claim 25, further comprising, after removing the transparent carrier, removing the opaque layer and the nonconductive layer to thereby form a reconstituted wafer, and comprising forming a redistribution layer on the reconstituted wafer.

27. A method of processing a semiconductor element comprising:
providing a first bonded structure having a first semiconductor element on a first carrier structure, the first semiconductor element having a first side on the first carrier structure and a second side opposite the first side;
thinning the first semiconductor element from the second side of the first semiconductor element while the first semiconductor element is on the first carrier structure;
providing a second bonded structure having a second semiconductor element on a second carrier structure, the second semiconductor element having a first side on the second carrier structure and a second side opposite the first side;

directly bonding the second side of the first semiconductor element to the second side of the second semiconductor element while the first semiconductor element is on the first carrier structure and while the second semiconductor element is on the second carrier structure to form a bonded semiconductor structure; and after the directly bonding, removing both the first and second carrier structures from the bonded semiconductor structure.

28. The method of claim 27, further comprising thinning the second semiconductor element from the second side of the semiconductor element while the second semiconductor element is on the second carrier structure.

29. The method of claim 27, wherein removing at least one of the first and second carrier structures comprises exposing a photolysis layer to light.

30. The method of claim 27, further comprising processing the second side of the first semiconductor element while the first semiconductor element is on the first carrier structure.

31. The method of claim 27, wherein the first carrier structure comprises a transparent carrier and an intermediate structure over the transparent carrier, the intermediate structure comprising a nonconductive layer, a photolysis layer, and an opaque layer.

* * * * *